(12) United States Patent
Pfitzer et al.

(10) Patent No.: US 9,705,310 B2
(45) Date of Patent: Jul. 11, 2017

(54) ADAPTIVE FAULT CLEARING BASED ON POWER TRANSISTOR TEMPERATURE

(71) Applicant: Thomas & Betts International, LLC, Wilmington, DE (US)

(72) Inventors: Hans-Erik Pfitzer, Chesterfield, VA (US); Justin Walraven, San Diego, CA (US)

(73) Assignee: Thomas & Betts International LLC, Wilmington, DE (US)

( * ) Notice: Subject to any disclaimer, the term of this patent is extended or adjusted under 35 U.S.C. 154(b) by 320 days.

(21) Appl. No.: 14/518,311

(22) Filed: Oct. 20, 2014

(65) Prior Publication Data

US 2015/0146327 A1    May 28, 2015

Related U.S. Application Data

(60) Provisional application No. 61/908,992, filed on Nov. 26, 2013.

(51) Int. Cl.
| | | |
|---|---|---|
| *H02H 7/122* | (2006.01) | |
| *H02H 3/093* | (2006.01) | |
| *H03K 17/082* | (2006.01) | |
| *H02H 3/00* | (2006.01) | |
| *H02H 3/08* | (2006.01) | |

(52) U.S. Cl.
CPC ............ *H02H 7/122* (2013.01); *H02H 3/006* (2013.01); *H02H 3/085* (2013.01); *H02H 3/093* (2013.01); *H03K 17/0822* (2013.01); *H03K 17/0828* (2013.01)

(58) Field of Classification Search
CPC ........ H02H 3/006; H02H 3/085; H02H 3/093; H02H 7/122; H03H 17/0822; H03H 17/0828
USPC .......................................................... 361/18
See application file for complete search history.

(56) References Cited

U.S. PATENT DOCUMENTS

| | | |
|---|---|---|
| 4,245,318 A | 1/1981 | Eckart et al. |
| 4,346,424 A | 8/1982 | Hansen |
| 4,538,199 A | 8/1985 | Bielinski et al. |
| 4,937,697 A * | 6/1990 | Edwards ............... H02H 5/044 323/276 |
| 4,937,757 A | 6/1990 | Dougherty |

(Continued)

*Primary Examiner* — Thienvu Tran
*Assistant Examiner* — Kevin J Comber
(74) *Attorney, Agent, or Firm* — Taft Stettinius & Hollister LLP

(57) ABSTRACT

A system includes a current measurement unit, an overload timer, and a processing unit. The current measuring unit measures current through a power transistor, and the overload timer measures an overload time associated with the measured current. The processing unit receives a user-specified overload time setting or a user-specified overload amperage setting associated with a protection device connected in series with a load, receives a temperature measurement of a component associated with the power transistor or a measurement of overload time associated with the current, wherein the power transistor supplies the current to the load and the protection device, and selectively turns off the power transistor based on the measured temperature, the measured current through the power transistor, and the user-specified overload amperage setting or based on the measured temperature, the measured overload time, and the user-specified overload time.

30 Claims, 17 Drawing Sheets

(56) References Cited

U.S. PATENT DOCUMENTS

| | | |
|---|---|---|
| 4,967,304 A | 10/1990 | Dougherty |
| 5,241,444 A | 8/1993 | Yeh |
| 5,367,427 A | 11/1994 | Matsko et al. |
| 5,394,287 A | 2/1995 | Sakata et al. |
| 5,418,677 A | 5/1995 | Engel |
| 5,483,408 A | 1/1996 | Matsko et al. |
| 5,987,393 A * | 11/1999 | Stinson ................ H02H 3/0935 361/94 |
| 6,055,145 A | 4/2000 | Lagree et al. |
| 6,633,474 B1 | 10/2003 | Boudaud |
| 6,700,804 B1 | 3/2004 | Reichard |
| 6,798,630 B1 | 9/2004 | Del Vecchio et al. |
| 6,972,972 B2 * | 12/2005 | Duncan ................ H02M 7/003 363/131 |
| 7,746,616 B2 | 6/2010 | Arndt |
| 7,747,356 B2 | 6/2010 | Andarawis et al. |
| 7,763,993 B2 | 7/2010 | Groff et al. |
| 7,821,376 B2 | 10/2010 | Song |
| 7,844,439 B2 | 11/2010 | Nasle et al. |
| 7,844,440 B2 | 11/2010 | Nasle et al. |
| 2002/0153238 A1 | 10/2002 | Baldauf et al. |
| 2007/0076342 A1 | 4/2007 | Arndt |
| 2009/0257156 A1 | 10/2009 | Vicente et al. |
| 2010/0103711 A1 | 4/2010 | Komatsuzaki |
| 2012/0286729 A1 * | 11/2012 | Yegin .................... B60L 3/0069 320/109 |
| 2012/0306274 A1 | 12/2012 | Shetler, Jr. et al. |

* cited by examiner

ADAPTIVE FAULT CLEARING BASED ON POWER TRANSISTOR TEMPERATURE

CROSS-REFERENCE TO RELATED APPLICATION

This application claims priority under 35 U.S.C. §119, based on U.S. Provisional Application No. 61/908,992, filed Nov. 26, 2013, the disclosure of which is hereby incorporated by reference herein.

BACKGROUND

Uninterruptible power supply (UPS) systems provide back-up power to various types of systems when there is a failure of the utility power source to supply power. In the event of a failure of the utility power source, the UPS identifies the failure, and switches to an alternative back-up power source. The back-up power source may include a battery, a flywheel converter, or other types of energy storage devices.

DETAILED DESCRIPTION OF THE PREFERRED EMBODIMENTS

The following detailed description refers to the accompanying drawings. The same reference numbers in different drawings may identify the same or similar elements. The following detailed description does not limit the invention.

Inverters used in UPS systems typically use a fixed combination of time and amperage level to define fault clearing capability. A fault is defined as very low impedance on an electric distribution bus that causes the inverter to limit amperage and, therefore, lose voltage regulation. Upon the occurrence of a fault, the inverter opens a protection device, such as a fuse or breaker. The fault clearing mechanisms may consider worst case nominal operating conditions and extrapolate the temperature rise of a semiconductor device such that it does not exceed manufacturer's recommendations. Such fault clearing mechanisms, due to considering only worst case nominal operating conditions, leave much of the fault clearing capability unavailable for responding to fault conditions. In most applications, UPS systems are operated at room temperatures and at loads between 50% and 80%, and are not operated at worst case conditions. Additionally, the fault clearing mechanisms typically fix the fault clearing overload amperage setting and the overload time setting at the factory such that they cannot be changed.

Exemplary embodiments described herein implement a technique for adaptively turning off UPS power transistors (IGBTs, metal oxide semiconductor field effect transistors (MOSFETs), or junction gate field effect transistors (JFETs)), to prevent transistor overload damage, based on a measurement of a temperature associated with the heat sink of the transistor, and based on user preferences. The user preferences may specify user configurable time or amperage settings that specify either the overload current level, or the overload time, at which the inverter in the UPS system turns off the inverter transistors (e.g., IGBTs). The adaptive overload technique described herein coordinates the overload current level and the overload time such that they are best suited to clear the protection device(s) of the one or more loads powered by the UPS system. For example, if the protection device(s) includes fuses, then an optimized overload current level and overload time would allow for more current for less time to clear the fuses. In a breaker system, an optimized overload current level and overload time would allow for a longer overload time because of the mechanical, and relatively slow, nature of the breakers.

Figure 1:
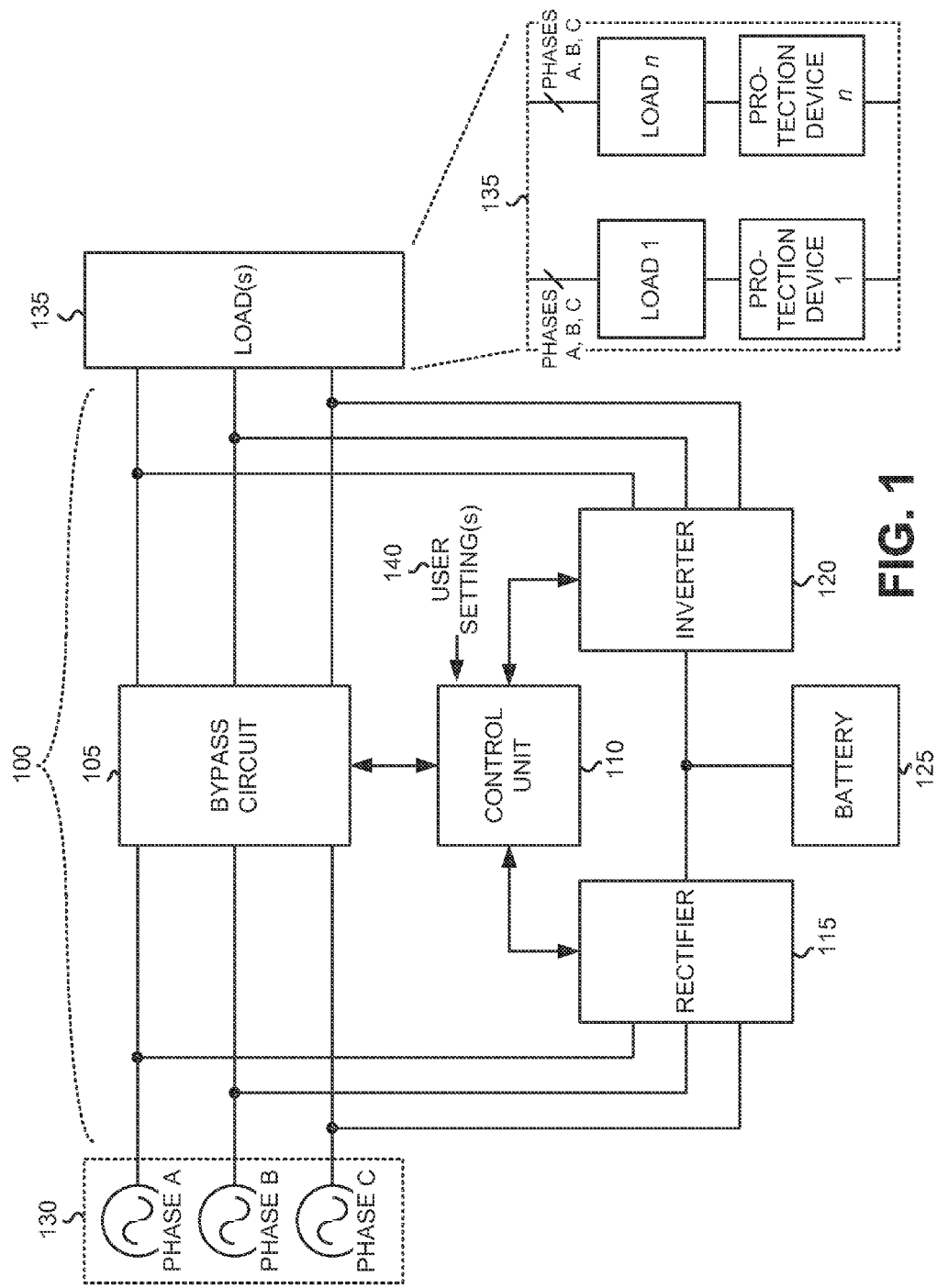
FIG. 1 is a diagram that illustrates an exemplary uninterruptible power supply (UPS) system that may be used for powering a load instead of a utility power source.

FIG. 1 illustrates an exemplary UPS system 100 that may be used for alternatively powering a load, instead of the load being powered by a utility power source. As shown in FIG. 1, UPS system 100 may include a bypass circuit 105, a control unit 110, a rectifier 115, an inverter 120 and a battery 125.

Control unit 110 operates to select an operation mode of UPS system 100, and then to control the operation of rectifier 115, inverter 120 and bypass circuit 105 based on the selected operation mode. In a first operation mode, control unit 110 causes bypass circuit to switch the three phase alternating current (AC) power output from utility power source 130 through to load 135. In this first operation mode, rectifier 115 converts the AC power supplied from utility power source 130, into direct current (DC) power, and supplies the DC power for storage in battery 125. Additionally, in the first operation mode, control unit 110 deactivates inverter 120 to prevent inverter 120 from converting the DC power stored in battery 125 into AC power and supplying it to load 135. As shown in FIG. 1, load(s) 135 may include load 1 through load n connected in parallel for powering by either utility power source 130 or by battery 125 via inverter 120, wherein n is greater than or equal to one. As further shown in FIG. 1, each of load 1 through load n may be connected in series with a respective protection device 1 through n. Each of the protection devices may include a fuse, breaker, or other type of protection device that opens under fault conditions to stop the flow of current through a respective load.

When a failure associated with utility power source 130 occurs, control unit 110 selects a second operation mode in which control unit 110 causes bypass circuit 105 to switch open the connection between the utility power source 130 and load 135. Additionally, in the second operation mode, control unit 110 activates inverter 120 such that inverter 120 converts the DC power from battery 125 into AC power, and supplies the converted AC power, as an output of inverter 120, to load 135.

In exemplary embodiments described herein, control unit 110 may select a third operation mode based on a temperature measurement associated with an IGBT module contained within inverter 120. In this third mode of operation, described in further detail below, control unit 110 may cause IGBTs (or MOSFETs, or JFETs) in the transistor (IGBT) module of inverter 120 to turn off, based at least in part upon the temperature measurement associated with the IGBT module and user settings 140, to prevent overload conditions from damaging the IGBT module of inverter 120, but, however, to enable inverter 120 to supply a sufficient current for a sufficient period of time to open a protection device(s) in load(s) 135. The user settings 140 may include user customizable values that further include a user-specified maximum current required for opening a protection device(s) in load(s) 135, or a user-specified overload time that indicates a minimum time needed for a protection device(s) in load(s) 135 to open.

The configuration of components of UPS system 100 illustrated in FIG. 1 is for illustrative purposes. Other configurations may be implemented. Therefore, UPS system 100 may include additional, fewer and/or different components than those depicted in FIG. 1.

Figure 2:
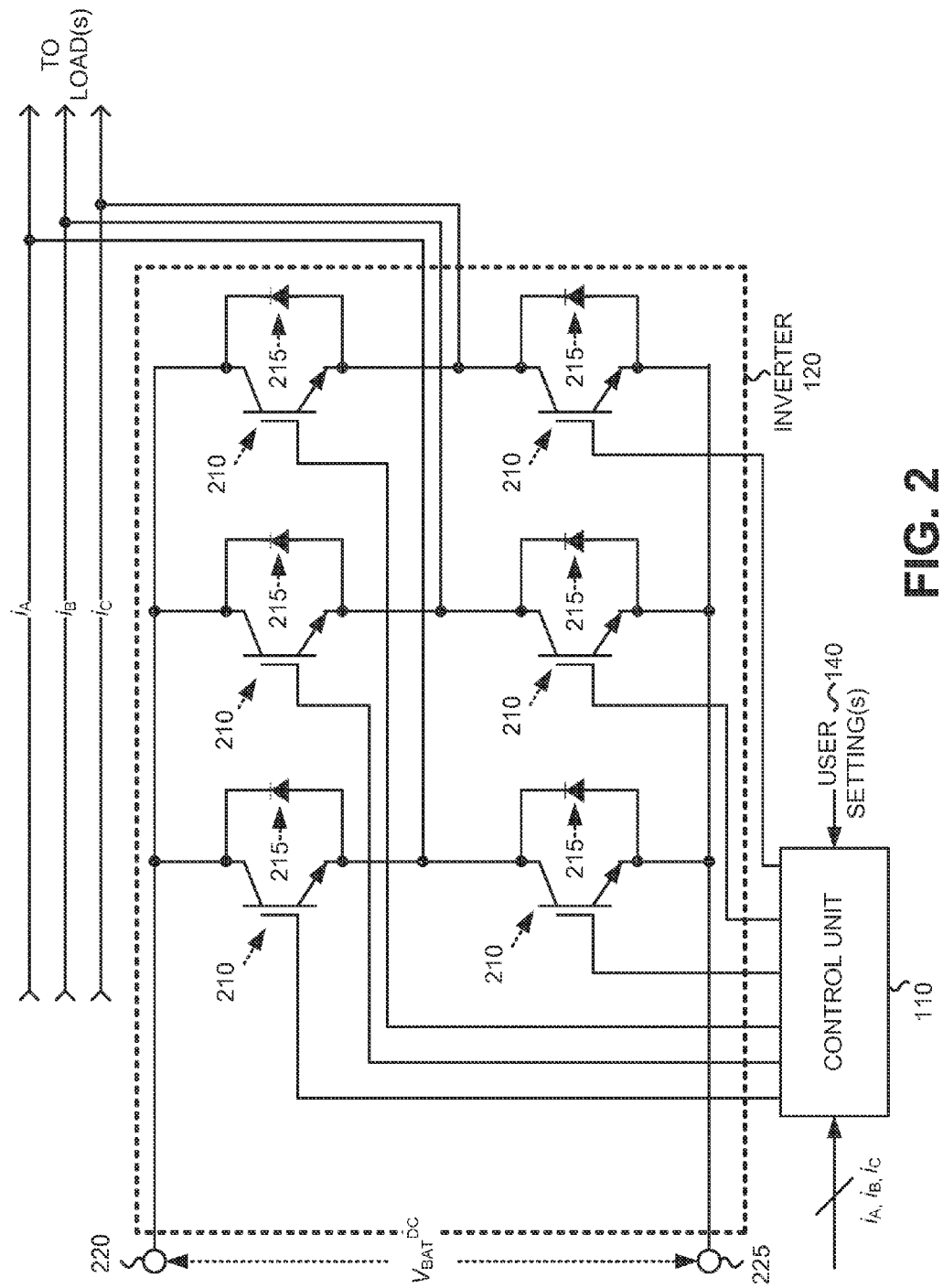
FIG. 2 depicts components of the inverter of the UPS system of FIG. 1 according to an exemplary embodiment.

FIG. 2 depicts components of inverter 120 of UPS system 100 according to an exemplary embodiment. As shown, inverter 120 may include multiple pulse-width modulated (PWM) bridge circuits coupled between DC buses 220 and 225. The DC power from battery 125 (not shown in FIG. 2) is applied across buses 220 and 225. Each of the multiple PWM bridge circuits may include an IGBT 210 and a power diode 215 connected in parallel. The collectors of a first set of three of IGBTs 210 (the upper three IGBTs 210 depicted in FIG. 2) may connect to bus 220, and the emitters of the first three of IGBTs 210 may connect in series to the collectors of a second set of three IGBTs 210 (the lower three IGBTs 210 depicted in FIG. 2). The emitters of the second set of three IGBTs 210 may be connected to bus 225. Each base of IGBTs 210 may be connected to a control line from control unit 110. Control unit 110 may drive the multiple PWM bridge circuits via the separate control lines connected to each IGBT 210 base. Control unit 110 may control the biasing of the bases of IGBTs 210 of the PWM bridge circuits so as to convert the DC power applied at buses 220 and 225 from battery 125 to AC power output from inverter 120. Control unit 110 may act to control duty cycles of IGBTs 210 of the PWM bridge circuits to equalize the phase currents $i_A$, $i_B$ and $i_C$ output from inverter 120. Control unit 110 may additionally control the biasing of the bases of IGBTs 210 of the PWM bridge circuits to supply sufficient current, for a sufficient period of time, to open a protection device(s) of load(s) 135 under fault conditions, and then to turn off the IGBTs 210 to prevent damage to IGBTs 210. The sufficient current, or the sufficient period of time, to open the protection device(s) of load(s) 135 will be determined based on user settings 140 input to control unit 110.

The configuration of components of inverter 120 illustrated in FIG. 2 is for illustrative purposes. Other configurations may be implemented. Therefore, inverter 120 may include additional, fewer and/or different components than those depicted in FIG. 2. Inverter 120 has been described as including multiple IGBTs 210. However, other types of power transistors may be used in inverter 120, such as, for example, metal oxide semiconductor field effect transistors (MOSFETs), or junction gate field effect transistors (JFETs).

Figure 3:
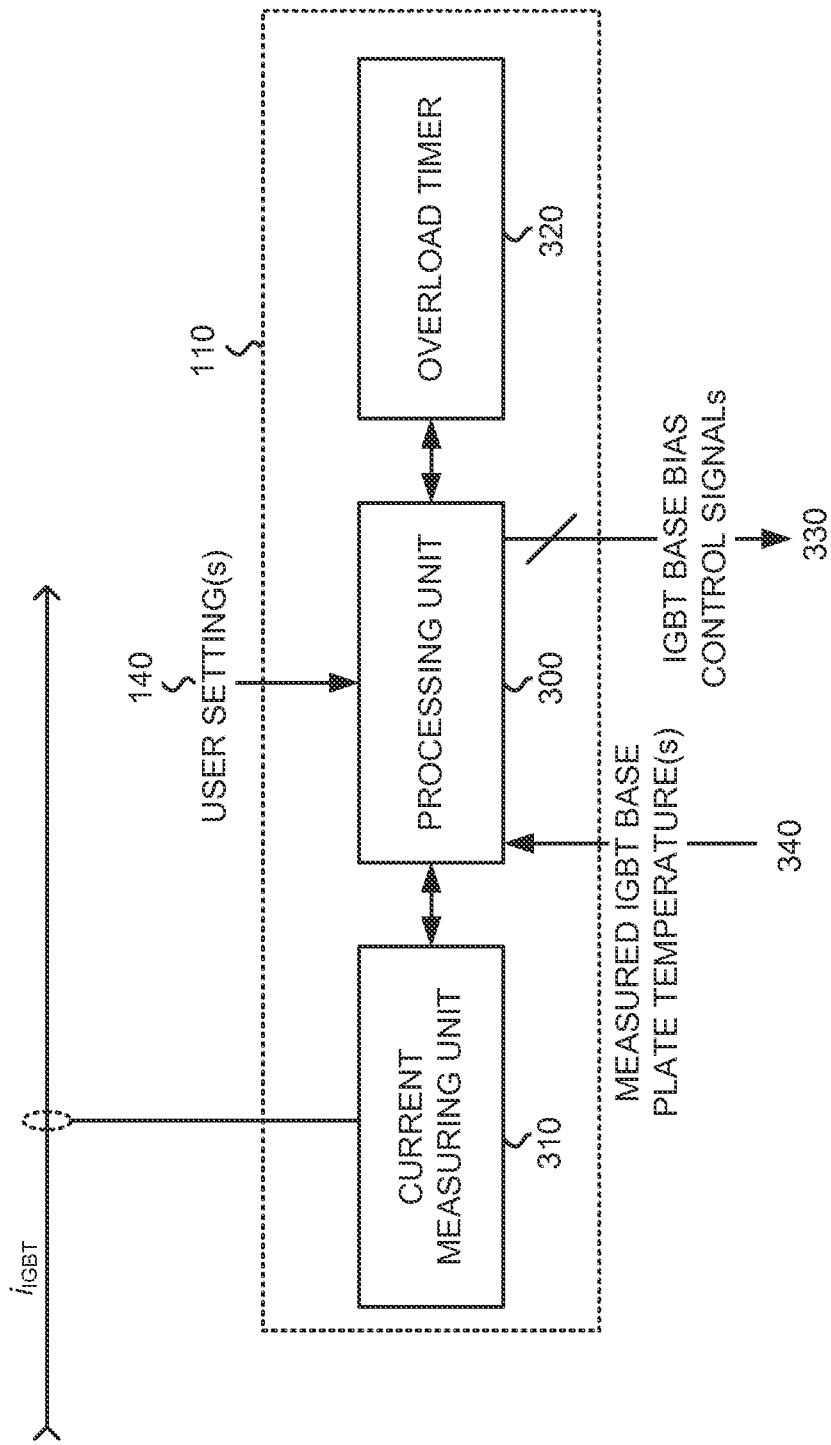
FIG. 3 illustrates components of the control unit of FIG. 1 according to an exemplary embodiment.

FIG. 3 illustrates components of control unit 110 according to an exemplary embodiment. Control unit 110 may include a processing unit 300, a current measuring unit 310, and an overload timer 320.

Processing unit 300 may include one or more processors or microprocessors which may interpret and execute instructions. The instructions may be stored in a memory device(s) (not shown) which may be retrieved and executed to perform the exemplary processes described herein. Alternatively, processing unit 300 may include processing logic. The memory device(s) may include a random access memory (RAM) or other type of dynamic storage device that may store information and instructions for execution by processing unit 300. The memory device(s) may further include a Read Only Memory (ROM) or another type of static storage device that may store static information and instructions for use by processing unit 300. The memory device(s) may additionally include a magnetic and/or optical recording medium. The memory device(s) may be referred to herein as a "non-transitory computer-readable medium" and/or a "tangible computer-readable medium." The processes/methods described herein can be implemented as instructions that are stored in the memory device for execution by processing unit 300.

Current measuring unit 310 may include circuitry for measuring IGBT current(s). Current measuring unit 310 may supply data associated with measurements of the IGBT current(s) to processing unit 300. Overload timer 320 may measure an elapsed overload time associated with the operation of IGBTs 210 of inverter 120 (e.g., associated with a step in current through the IGBTs 210). Overload timer 320 may supply data indicating the elapsed overload time to processing unit 300.

Processing unit 300 may control the biasing of the bases of IGBTs 210 of inverter 120 via output control signals 330 supplied to inverter 120 via the control lines depicted in FIG. 2. Processing unit 300 may generate bias control signal(s) 330 for output to the bases of IGBTs of inverter 120 based on the elapsed overload time(s) received from overload timer 320, measured IGBT base plate temperatures 340 received from an IGBT module (described below with respect to FIG. 4) associated with the IGBTs 210 of inverter 120, measured phase currents received from current measuring unit 310, and user settings 140. Processing unit 300 may implement the exemplary processes of FIGS. 5, 8, 11 and 14A & 14B, described below, to generate the bias control signal(s) 330 used to control the operation of IGBTS 210 of inverter 120.

The configuration of components of control unit 110 illustrated in FIG. 3 is for illustrative purposes. Other configurations may be implemented. Therefore, control unit 110 may include additional, fewer and/or different components than those depicted in FIG. 3. For example, though not shown in FIG. 3, control unit 110 may include an input device, or user interface device, that permits a user to enter user settings 140 that include the user-configurable time or amperage settings associated with one or more protection devices in load(s) 135.

Figure 4:
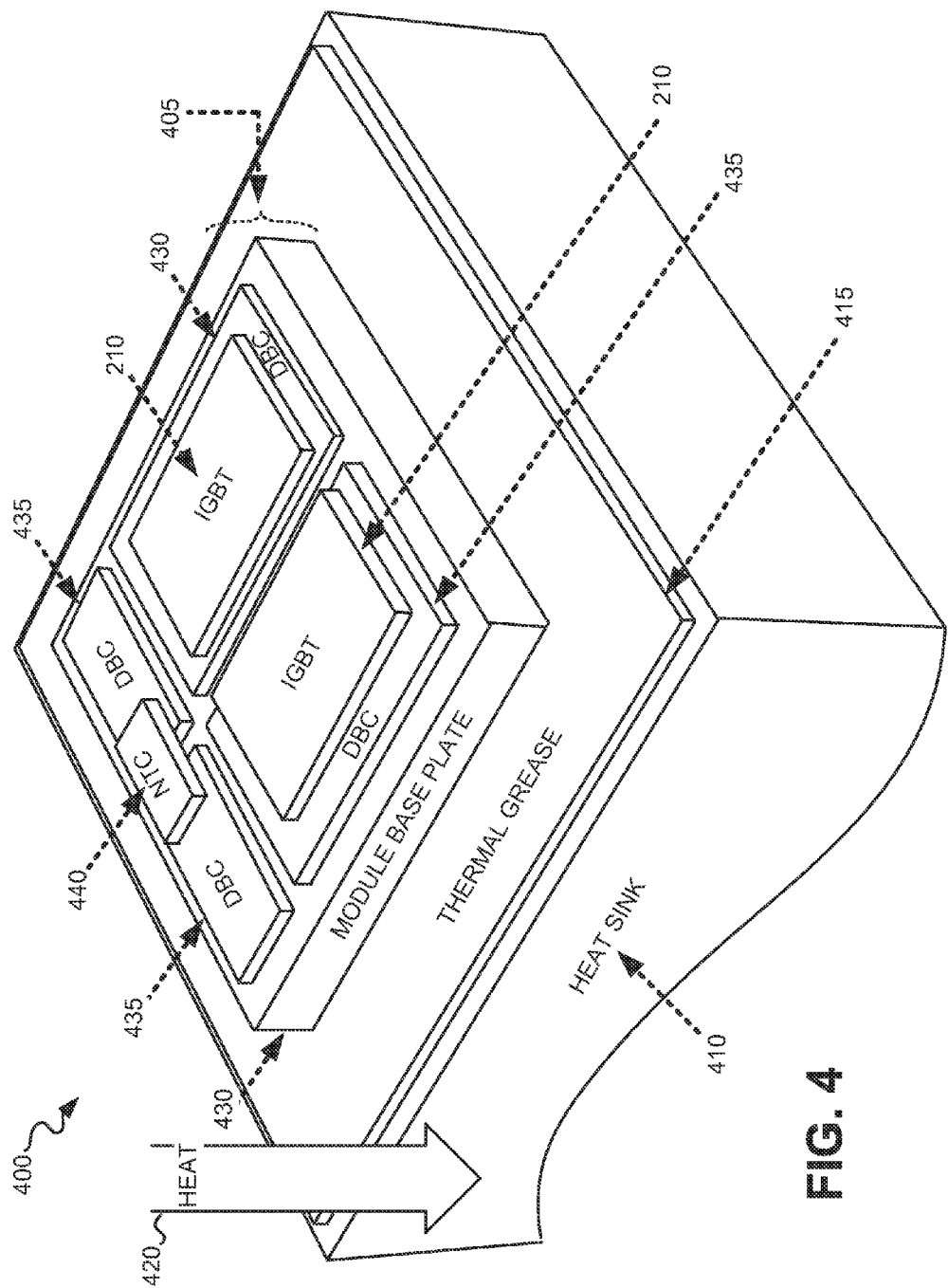
FIG. 4 illustrates exemplary details of a portion of a semiconductor package that includes an insulated gate bipolar transistor (IGBT) module formed over a heat sink, with an intervening interface layer.

FIG. 4 illustrates exemplary details of a portion of a semiconductor package 400 that includes an IGBT module 405 formed over a heat sink 410, with an intervening interface layer 415 that may include, for example, a layer of thermal grease. Interface layer 415 may conduct heat 420, generated due to the flow of current through IGBTs 210 of IGBT module 405, from IGBT module 405 to heat sink 410 for dissipation. Two IGBTs 210 are shown in FIG. 4 for simplicity of illustration. IGBT module 405 may include any multiple number of IGBTs 210 (such as six IGBTs 210, as shown in inverter 120 of FIG. 2).

IGBT module 405 may include a module base plate 430 formed upon interface layer 415 and a bonding layer 435 formed in various patterns upon module base plate 430. A bonding layer 430 may be formed beneath each one of IGBTs 210 to bond each of the IGBTs 210 to module base plate 430. Bonding layer 430 may include, for example, a layer of direct bond copper (DBC) for bonding each IGBT 210 to module base plate 430. A negative temperature thermistor (NTC) 440 may further be formed upon bonding layer 435 to permit the measurement of a temperature of base plate 430.

Using the first law of thermodynamics:

$$\dot{E} = q - \dot{W} = \text{rate of energy transfer} \qquad \text{Eqn. (1)}$$

where q=heat transfer rate, and
$\dot{W}$=work rate

Heat 420 conducts through all of the layers of semiconductor package 400 between IGBTs 210 and heat sink 410, and then out to the environment via convection. The rate of heat generation as a result of losses in the IGBTs is known. No work is done by the heat generated by IGBTs 210, therefore, the heat transfer rate is the only concern when determining the temperature of IGBTs 210. Fourier's Law states:

$$q_x'' = -k \frac{dT}{dx} = \qquad \text{Eqn. (2)}$$

heat transfer rate per unit area in the direction of $x$ where k is the thermal conductivity of the heat transfer medium (in this case, an average of the IGBT 210 to heat sink 410 stack).

Eqn. (2) provides the heat transfer rate per unit area. To find the heat transfer rate:

$$q_x'' = -k \frac{dT}{dx} = \qquad \text{Eqn. (3)}$$

heat transfer rate per unit area in the direction of $x$

Assuming a linear temperature gradient:

$$q_x = -kA \frac{T_1 - T_2}{L} \qquad \text{Eqn. (4)}$$

where
$T_1$=the IGBT 210 temperature (i.e., hot side temperature),
$T_2$=the heat sink 410 temperature (i.e., cold side temperature), and
L=the thickness of the IGBT to heat sink stack (i.e., layers in semiconductor 400 from IGBT 210 to heat sink 410).

Using the energy equation:

$$E = mC\Delta T \qquad \text{Eqn. (5)}$$

where
E=energy,
m=mass,
C=specific heat,
$\Delta T$=change in temperature,
and taking the energy equation's derivative:

$$\dot{E} = \frac{d}{dt} mC\Delta T = mC \frac{dT}{dt} \qquad \text{Eqn. (6)}$$

Taking the LaPlace transform of Eqn. (6):

$$smCT_1 = q_{loss} - kA \frac{T_1 - T_2}{L} \qquad \text{Eqn. (7)}$$

If temperature $T_2$ is constant, than it can be removed from the small signal model (it will be added back in later as a base temperature to which a temperature rise will be applied).

$$smC\hat{T}_1 = \hat{q}_{loss} - kA \frac{\hat{T}_1}{L} \qquad \text{Eqn. (8)}$$

$$smC = \frac{q_{loss}}{\hat{T}_1} - kA \frac{1}{L} \qquad \text{Eqn. (9)}$$

$$smC + \frac{kA}{L} = \frac{q_{loss}}{\hat{T}_1} \qquad \text{Eqn. (10)}$$

$$\frac{\hat{T}_1}{\hat{q}_{loss}} = \frac{1}{smC + \frac{kA}{L}} \qquad \text{Eqn. (11)}$$

$$\frac{\hat{T}_1}{\hat{q}_{loss}} = \frac{\frac{1}{mC}}{s + \frac{kA}{mCL}} \qquad \text{Eqn. (12)}$$

If the input q takes the form of a unit step, then:

$$\hat{T}_1 = \frac{\frac{1}{mC}}{s\left(s + \frac{kA}{mCL}\right)} \qquad \text{Eqn. (13)}$$

Taking the inverse LaPlace transform produces the time-domain solution to a unit step response in q:

$$T_{1-rise}(t) = \quad\quad\text{Eqn. (14)}$$

$$\frac{1}{mC}\left[\frac{1}{\left(\frac{kA}{mCL}\right)}\left(1 - e^{-\frac{kA}{mCL}t}\right)\right] + \text{Constant} = \beta\frac{1}{\alpha}(1 - e^{-\alpha t})$$

If the mass, specific heat, thermal conductivity, and thickness (L) are known, the rise in IGBT temperature ($T_{1-rise(t)}$) may be calculated. However, the IGBT manufacturer rarely publishes this information. Instead, the manufacturer will often provide simulation software that enables the simulation of a step change in power loss through a step change in current through the IGBT 210. If the final value of $T_1$, and the time to 63% of the final value of $T_1$ are known, then α and β in Eqn. (14) can be found as follows:

$$\alpha = \frac{1}{t_{.63T_{1-rise}}} \quad\quad\text{Eqn. (15)}$$

$$\beta = \alpha T_{1-rise/W} \quad\quad\text{Eqn. (16)}$$

where $t_{0.63T_{1-rise}}$ is the time at which $T_1$ reaches 63% of its value, and $T_{1-rise/W}$ is the rise in temperature of the IGBT 210 as a result of 1 W of loss.

If Eqn. (14) is generalized to include steps that are not of unity magnitude, then Eqn. (14) can be rewritten as:

$$T_{1-rise}(t) = q_{step}\left(\beta\frac{1}{\alpha}(1 - e^{-\alpha t})\right) \quad\quad\text{Eqn. (17)}$$

Adding the heat sink temperature $T_2$ back into Eqn. (17), and recognizing that a maximum IGBT 210 junction temperature is known and an approximate q per unit current can be determined, Eqn. (17) can be further rewritten as:

$$T_{1-max}(t) = q_{step}(I) * \left(\beta\frac{1}{\alpha}(1 - e^{-\alpha t})\right) + T_2 \quad\quad\text{Eqn. (18)}$$

where $q_{step}(I)$ is q as a function of current.

In addition to the temperature rise as a result of the buildup of energy in the IGBT, there is a near instantaneous jump in IGBT temperature that happens when a step in current through the IGBT 210 is applied. The mechanism for this is presumably known to IGBT manufacturers, but is not published. However, the model provided by some manufacturers includes this effect and, therefore, a line of best fit can estimate this effect. This instantaneous jump in temperature can be added to Eqn. (18) as follows:

$$T_{1-max}(t) = q_{step}(I) * \left(\beta\frac{1}{\alpha}(1 - e^{-\alpha t})\right) + \Delta T_i(I_{initial}, \Delta I) + T_2 \quad\quad\text{Eqn. (19)}$$

where $\Delta T_i(I_{initial}, \Delta I)$ is the temperature jump as a function of the initial current and the change in current that occurs during the transition from normal operation to overload. To facilitate the solving of Eqn. (19), I can be replaced with $I_{initial} + \Delta I$:

$$T_{1-max}(t) = \quad\quad\text{Eqn. (20)}$$

$$q_{step}(I_{initial} + \Delta I) * \left(\beta\frac{1}{\alpha}(1 - e^{-\alpha t})\right) + \Delta T_i(I_{initial}, \Delta I) + T_2$$

If the junction temperature is held constant at a maximum, then: 1) the maximum overload current can be specified and a maximum overload time ($t_{max}$) produced given a known $T_2$ and an initial current ($I_{initial}$) (Eqn. (21) below); or 2) the maximum overload time ($t_{max}$) can be specified, and a maximum overload current ($\Delta I$) can be produced given a known $T_2$ and an initial current ($I_{initial}$) (Eqn. (22) below). Solving Eqn. (20) for the maximum overload time $t_{max}$ realizes the following expression that corresponds to 1) above:

$$t_{max} = \frac{-\ln\left[1 - \frac{(T_{1-max} - \Delta T_i(I_{initial}, \Delta t) - T_2)\alpha}{q_{step}(I_{initial} + \Delta I)\beta}\right]}{\alpha} \quad\quad\text{Eqn. (21)}$$

Solving Eqn. (20) for q as a function of current realizes the following expression that corresponds to 2) above:

$$q_{step}(I_{initial} + \Delta I) = \frac{(T_{1-max} - \Delta T_i(I_{initial}, \Delta I) - T_2)}{\beta\frac{1}{\alpha}(1 - e^{-\alpha t})} \quad\quad\text{Eqn. (22)}$$

Eqns. (21) and (22) cannot be solved analytically without knowing the form of a $q_{step}(I_{initial} + \Delta I)$ and $\Delta T_i(I_{initial}, \Delta I)$. $q_{step}(I_{initial} + \Delta I)$ may be determined using a stochastic method, as described below with respect to the exemplary process of FIG. 5. $\Delta T_i(I_{initial}, \Delta I)$ may further be determined using a stochastic method, as described below with respect to the exemplary process of FIG. 8.

Figure 5:
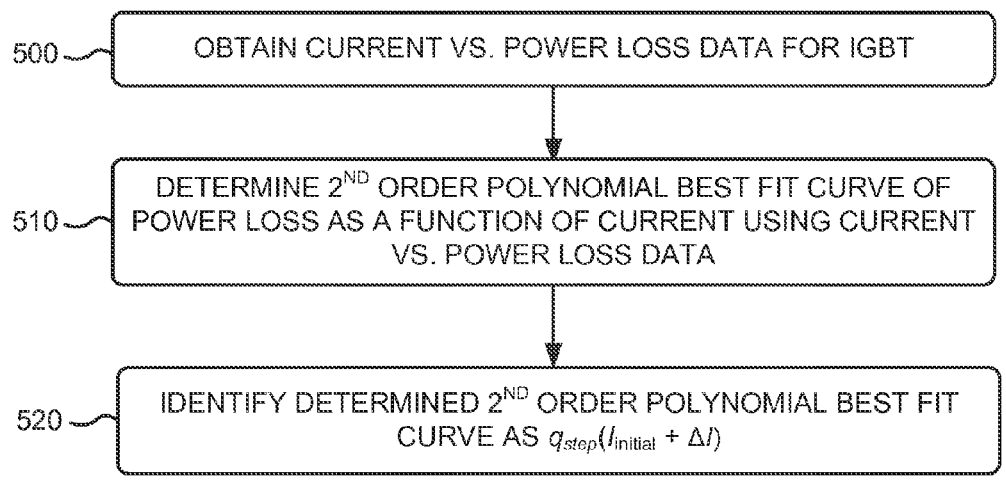
FIG. 5 is a flow diagram that illustrates an exemplary process for determining the form of a step in heat transfer as a function of initial current and a jump in current ($q_{step}$ ($I_{initial}+\Delta I$)

FIG. 5 is a flow diagram that illustrates an exemplary process for determining the form of a $q_{step}(I_{initial} + \Delta I)$, using a stochastic method, for further use in solving Eqn. (22) above. The exemplary process of FIG. 5 is described with respect to FIGS. 6 and 7.

Current versus power loss data is obtained for a given IGBT (block 500). For a given IGBT, manufacturer's thermal model simulation software may, for example, be used to obtain simulated power losses at certain currents and at given bus voltages. For example, the Infineon IPOSIM software may be used to simulate power losses for the Infineon FF600R06ME3 IGBT. The simulated power losses for bus 120V and 240V bus voltages at multiple simulated currents and at a heat sink temperature of 50° C. are depicted in Table 1:

TABLE 1

Simulated Infineon FF600R06ME3 Losses

| Current (A) | 120 V Bus Losses (W) | 240 V Bus Losses (W) |
|---|---|---|
| 300 | 468.288 | 596.106 |
| 350 | 564.438 | 712.728 |
| 400 | 666.45 | 833.664 |
| 450 | 774.27 | 962.936 |
| 500 | 888.222 | 1099.57 |
| 550 | 1008.28 | 1243.89 |

TABLE 1-continued

Simulated Infineon FF600R06ME3 Losses

| Current (A) | 120 V Bus Losses (W) | 240 V Bus Losses (W) |
|---|---|---|
| 600 | 1134.71 | 1396.26 |
| 650 | 1267.68 | 1557.09 |
| 700 | 1407.43 | 1727.02 |
| 750 | 1554.6 | 1906.13 |
| 800 | 1708.58 | 2095.59 |
| 850 | 1870.07 | 2295.66 |
| 900 | 2040.15 | not recommended |
| 950 | 2218.55 | not recommended |
| 1000 | 2405.89 | not recommended |

A second order polynomial best fit curve of power loss as a function of current is determined using the obtained current versus power loss data (block 510) and the determined second order polynomial best fit curve is identified as a $q_{step}(I_{initial}+\Delta I)$ (block 520). Though IGBT temperature affects power loss, it does not affect power loss as much as other factors. For example, for the FF600R06ME3 IGBT, only approximately 10% of the power loss is due to temperature from 10° C. to 160° C. The three main contributors to power loss are switching frequency, DC link voltage, and AC current through the IGBT. Generally, as any of these three contributors increase, so do power losses. If the maximum DC link voltage is known and the switching frequency is static, than an approximate curve of losses with respect to current may be found. Two common DC link voltages are 120V and 240V, and each of these DC link voltages has an associated maximum voltage. If these two maximum voltages are used in simulation, one curve for each of the DC link voltages can be determined by deriving a second order polynomial best fit curve of power loss as a function of current.

Figure 6:
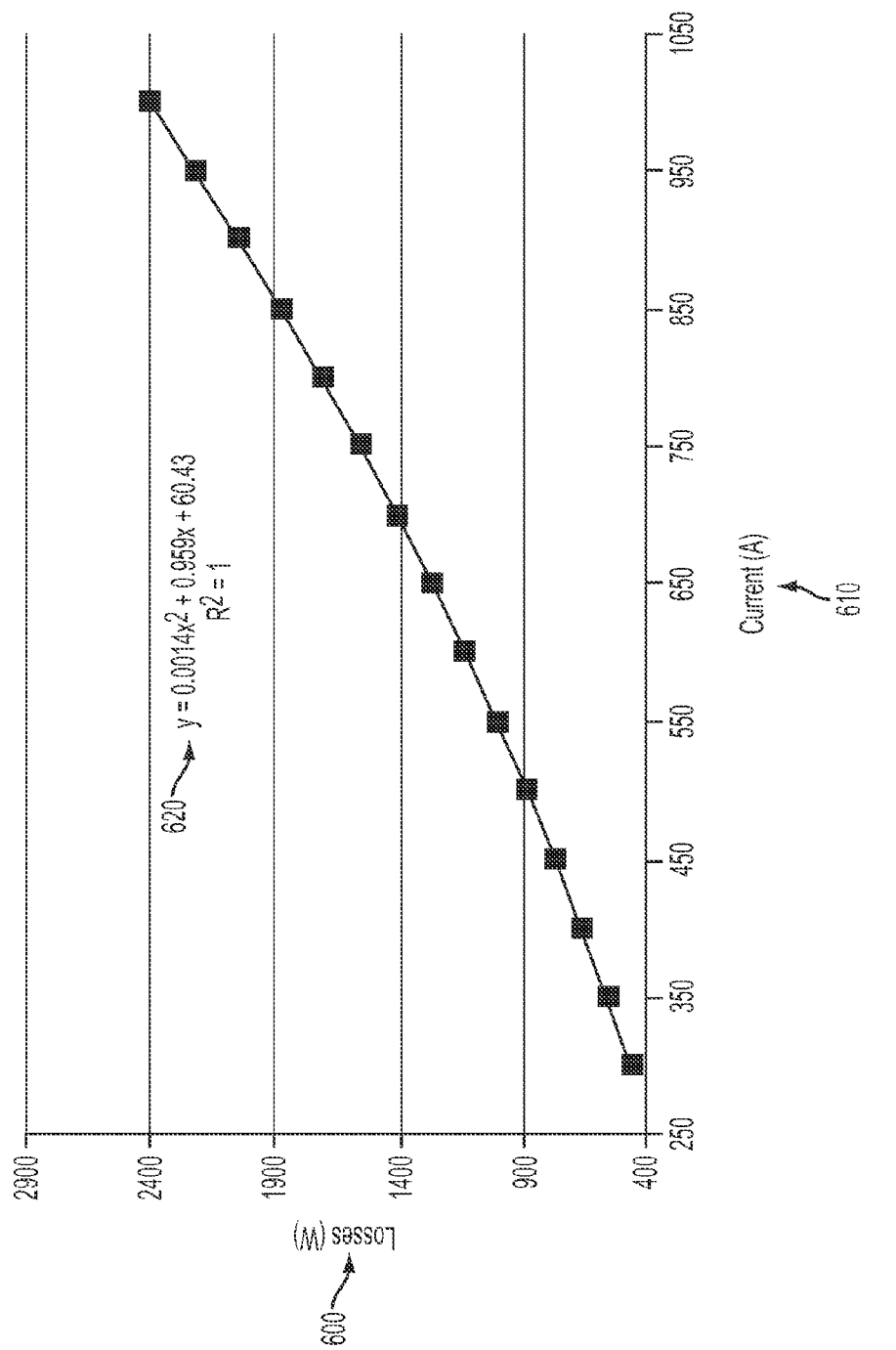
FIG. 6 is a diagram that depicts a plot of simulated losses versus current for an IGBT assuming a 120V DC link voltage and a 50° C. heat sink temperature.

A plot 620 of losses 600 versus current 610 using the 120V DC link data from Table 1 is depicted in the two-dimensional graph of FIG. 6. Performing a second order polynomial best fit of a curve to the data of the plot 620 in FIG. 6 obtains the curve:

$$y=0.0014x^2+0.959x+60.43 \quad \text{Eqn. (23)}$$

Figure 7:
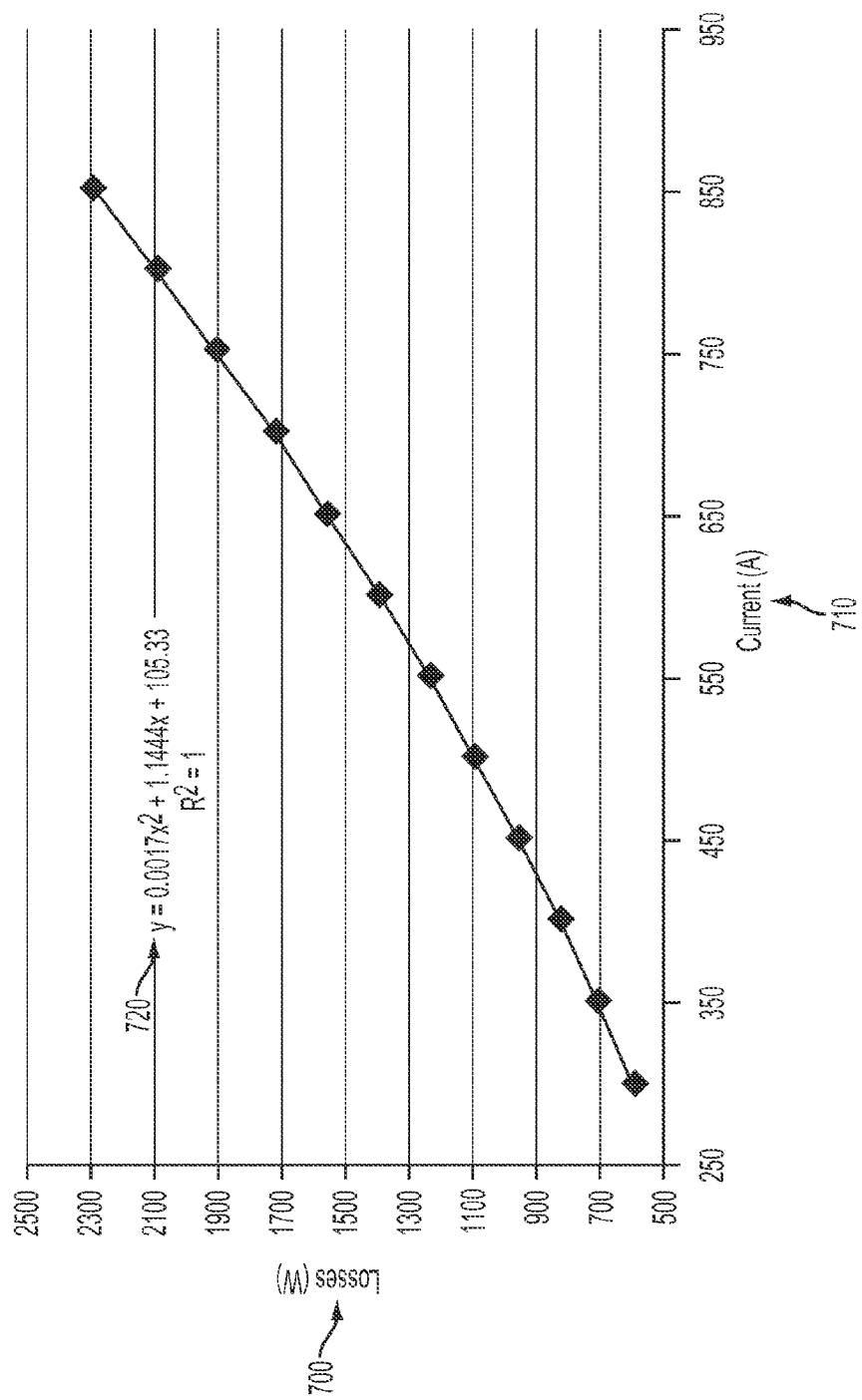
FIG. 7 is a diagram that depicts a plot of simulated losses versus current for an IGBT assuming a 240V DC link voltage and a 50° C. heat sink temperature.

A plot 720 of losses 700 versus current 710 using the 240V DC link data from Table 1 is depicted in the two-dimensional graph of FIG. 7. Performing a second order polynomial best fit of a curve to the data of the plot 720 in FIG. 7 obtains the curve:

$$y=0.0017x^2+1.1444x+105.33 \quad \text{Eqn. (24)}$$

One of the two curves of best fit (i.e., either Eqn. (23) or Eqn. (24)) may be selected for replacing $q_{step}(I_{initial}+\Delta I)$ in Eqns. (21) and/or (22) above, as further described below with respect to blocks 1420 and 1440 of the exemplary process of FIGS. 14A & 14B.

Figure 8:
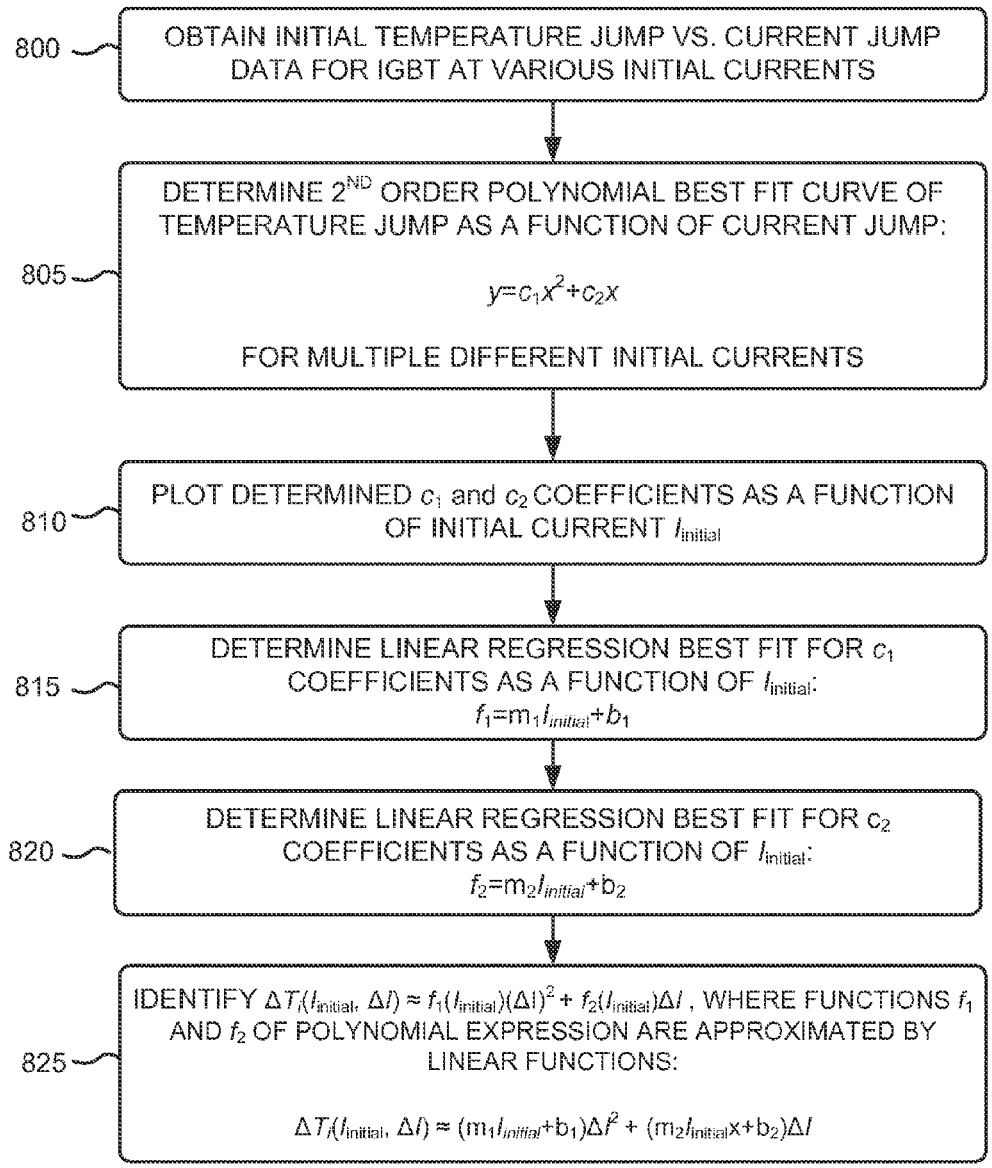
FIG. 8 is a flow diagram that illustrates an exemplary process for determining the form of an instantaneous jump in temperature of an IGBT as a function of initial IGBT current and a jump in IGBT current, using a stochastic method.

FIG. 8 is a flow diagram that illustrates an exemplary process for determining the form of $\Delta T_i(I_{initial}, \Delta I)$, using a stochastic method, for further solving Eqn. (22) above. The exemplary process of FIG. 8 is described with respect to FIGS. 9 and 10.

Figure 9:
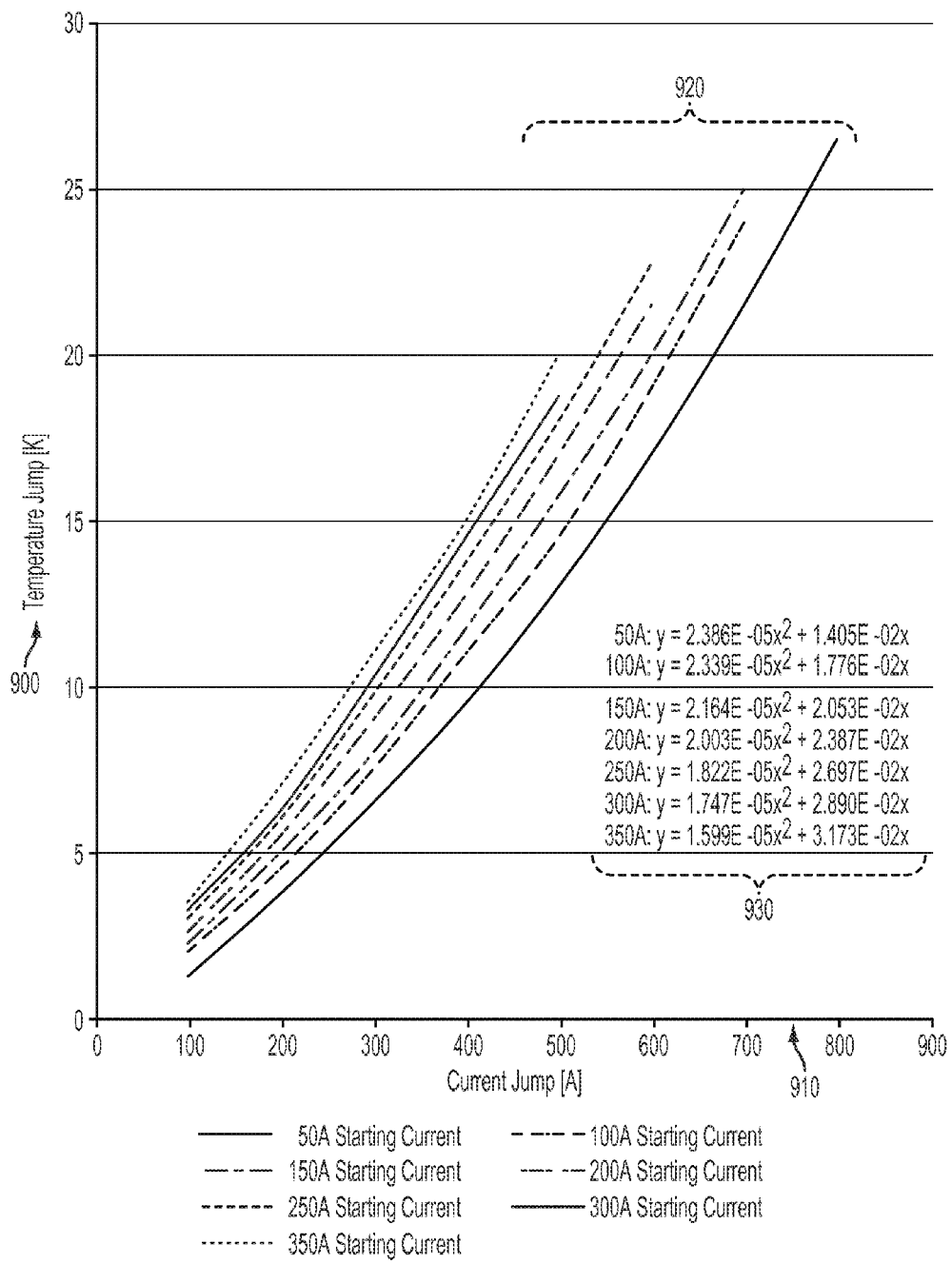
FIG. 9 is a diagram that depicts plots of IGBT temperature jumps versus jumps in current for several different initial IGBT currents.

Temperature jump versus current jump data at various initial currents is obtained for a given IGBT (block 800). For the given IGBT, the manufacturer's thermal model simulation software may, for example, be used to obtain simulated values of jumps in temperature of the IGBT based on simulated values of jumps in current and given a DC link voltage and initial (starting) values for IGBT current. The jumps in temperature 900 may be plotted versus jumps in current 910, as depicted in FIG. 9. Each plot from the set 920 of plots shown in FIG. 9 represents an initial starting current ($I_{initial}$) through the IGBT, and a plot of jumps in current ($\Delta I$) through the IGBT and corresponding jumps in temperature ($\Delta T_i(I_{initial}+\Delta I)$) of the IGBT for the FF600R06ME3 IGBT at a 135 V DC link voltage and at the initial starting current.

A second order polynomial best fit curve ($y=c_1 x^2+c_2 x$) of the temperature jump as a function of current jump for multiple different initial currents is determined (block 805). As depicted in FIG. 9, a family 930 of polynomial best fit curves is determined using the data obtained in block 800, with each of the best fit curves having a specified initial starting current ($I_{initial}$):

$I_{initial}$=50 A: $y=2.386E-05x^2+1.405E-02x$;
  $c_1$=2.386E-05 and $c_2$=1.405E-02   Eqn. (25A)

$I_{initial}$=100 A: $y=2.339E-05x^2+1.7765E-02x$;
  $c_1$=2.339E-05 and $c_2$=1.7765E-02   Eqn. (25B)

$I_{initial}$=150 A: $y=2.164E-05x^2+2.053E-02x$;
  $c_1$=2.164E-05 and $c_2$=2.053E-02   Eqn. (25C)

$I_{initial}$=200 A: $y=2.003E-05x^2+2.387E-02x$;
  $c_1$=2.003E-05 and $c_2$=2.387E-02   Eqn. (25D)

$I_{initial}$=250 A: $y=1.822E-05x^2+2.697E-02x$;
  $c_1$=1.822E-05 and $c_2$=2.697E-02   Eqn. (25E)

$I_{initial}$=300 A: $y=1.747E-05x^2+2.890E-02x$;
  $c_1$=1.747E-05 and $c_2$=2.890E-02   Eqn. (25F)

$I_{initial}$=350 A: $y=1.599E-05x^2+3.173E-02x$;
  $c_1$=1.599E-05 and $c_2$=3.173E-02   Eqn. (25G)

Figure 10:
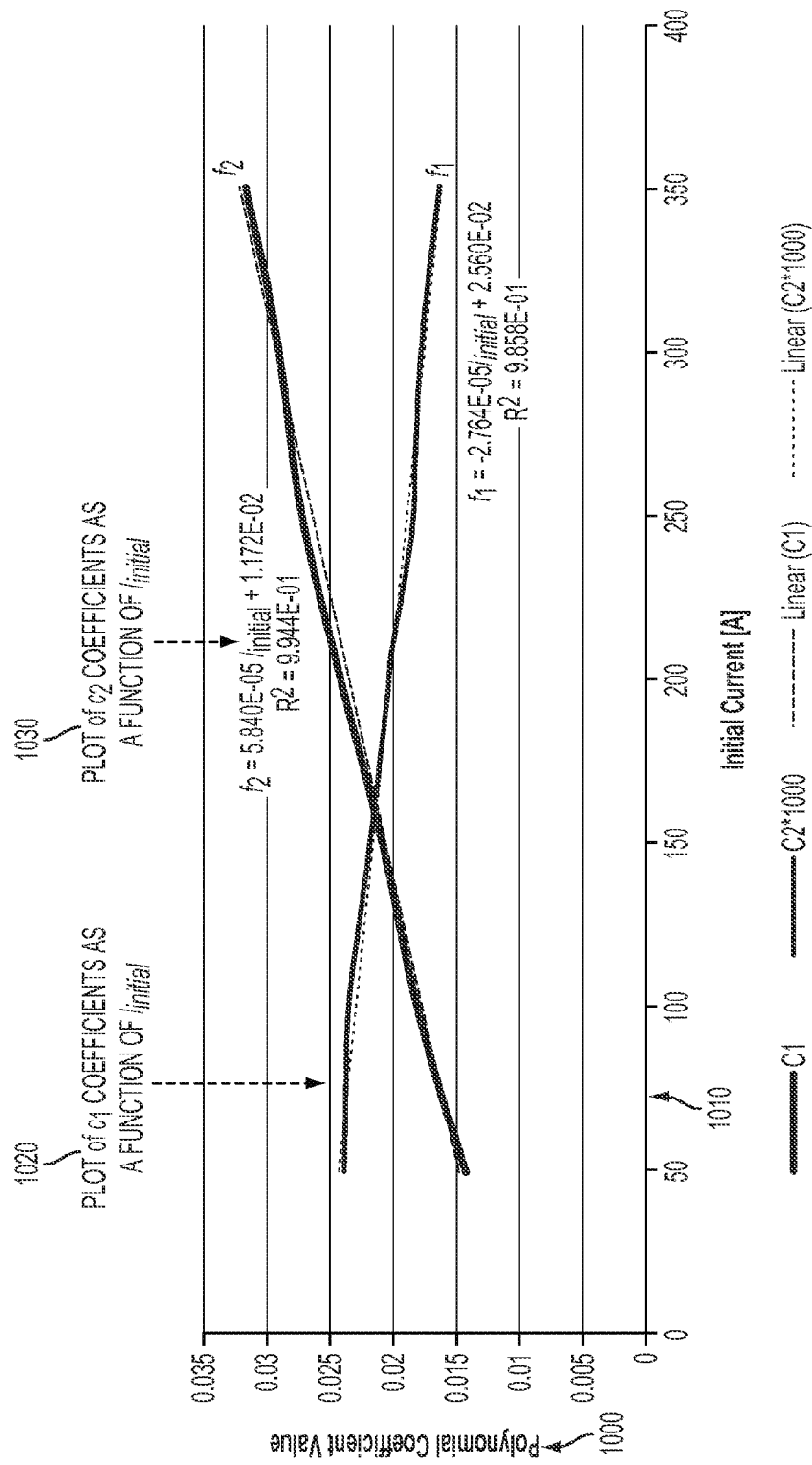
FIG. 10 is a diagram that depicts plots of the $c_1$ and $c_2$ coefficients of FIG. 9 as a function of initial IGBT current.

The determined $c_1$ and $c_2$ coefficients from the determined second order polynomial best fit curves may be plotted as a function of initial current $I_{initial}$ (block 810). For example, from Eqn. (25A), a $c_1$ of 2.386E-05 is plotted at an $I_{initial}$ of 50 A; from Eqn. (25B), a $c_1$ of 2.339E-05 is plotted at an $I_{initial}$=100 A; and so on including Eqns. (25C) through (25G), with a $c_1$ of 1.599E-05 being plotted at an $I_{initial}$=350 A for Eqn. (25G). An exemplary plot 1020 of the $c_1$ coefficients on a polynomial coefficient value axis 1000 and initial current axis 1010 is depicted in FIG. 10. From Eqn. (25A), a $c_2$ of 1.405E-02 is plotted at an $I_{initial}$ of 50 A; from Eqn. (25B), a $c_2$=1.7765E-02 is plotted at an $I_{initial}$=100 A; and so on including Eqns. (25C) through (25G), with a $c_2$ of 3.173E-02 being plotted at an $I_{initial}$=350 A for Eqn. (25G). An exemplary plot 1030 of the $c_2$ coefficients on the polynomial coefficient value axis 1000 and initial current axis 1010 is depicted in FIG. 10.

A linear regression best fit is determined for the $c_1$ coefficients as a function of $I_{initial}$: $f_1=m_1 I_{initial}+b_1$ (block 815). For example, a linear regression best fit curve is determined for plot 1020 of the $c_1$ coefficients of FIG. 10 to determine a linear equation in the form of $f_1=m_1 I_{initial}+b_1$. As shown in the example of FIG. 10, the determined linear regression best fit curve for plot 1020 of the $c_1$ coefficients is $f_1=-2.764E-05 I_{initial}+2.560E-02$.

A linear regression best fit is determined for the $c_2$ coefficients as a function of $I_{initial}$: $f_2=m_2 I_{initial}+b_2$ (block 820). For example, a linear regression best fit curve is determined for plot 1030 of the $c_2$ coefficients of FIG. 10 to determine a linear equation in the form of $f_2=m_2 I_{initial}+b_2$.

As shown in the example of FIG. 10, the determined linear regression best fit curve for plot 1030 of the $c_2$ coefficients is $f_2 = 5.840E\text{-}05\, I_{initial} + 1.172E\text{-}02$.

An equation for $\Delta T_i(I_{initial}, \Delta I) \approx f_1(I_{initial})\Delta I^2 + f_2(I_{initial})\Delta I$ may be identified, where functions $f_1$ and $f_2$ of the polynomial expression are approximated by linear functions: $\Delta T_i(I_{initial}, \Delta I) \approx (m_1 I_{initial} + b_1)\Delta I^2 + (m_2 I_{initial} + b_2)\Delta I$ (block 825). The best fit curve $f_1$ determined in block 815 is, therefore, inserted into the equation for $\Delta T_i(I_{initial}, \Delta I)$ to be multiplied by $\Delta I^2$. The best fit curve $f_2$ determined in block 820 is also inserted into the equation for $\Delta T_i(I_{initial}, \Delta I)$ to be multiplied by $\Delta I$. In the example of FIG. 10, the determined best fit curves for $f_1$ and $f_2$ may be inserted into the equation for $\Delta T_i(I_{initial}, \Delta I)$ as:

$$\Delta T_i(I_{initial}, \Delta I) \approx (-2.764E\text{-}05 I_{initial} + 2.560E\text{-}02)\Delta I^2 + (5.840E\text{-}05 + 1.172E\text{-}02)\Delta I \quad \text{Eqn. (26)}$$

The equation for $\Delta T_i(I_{initial}, \Delta I)$ determined in block 825 is used in blocks 1420 and 1440 of the exemplary process of FIGS. 14A & 14B below.

Figure 11:
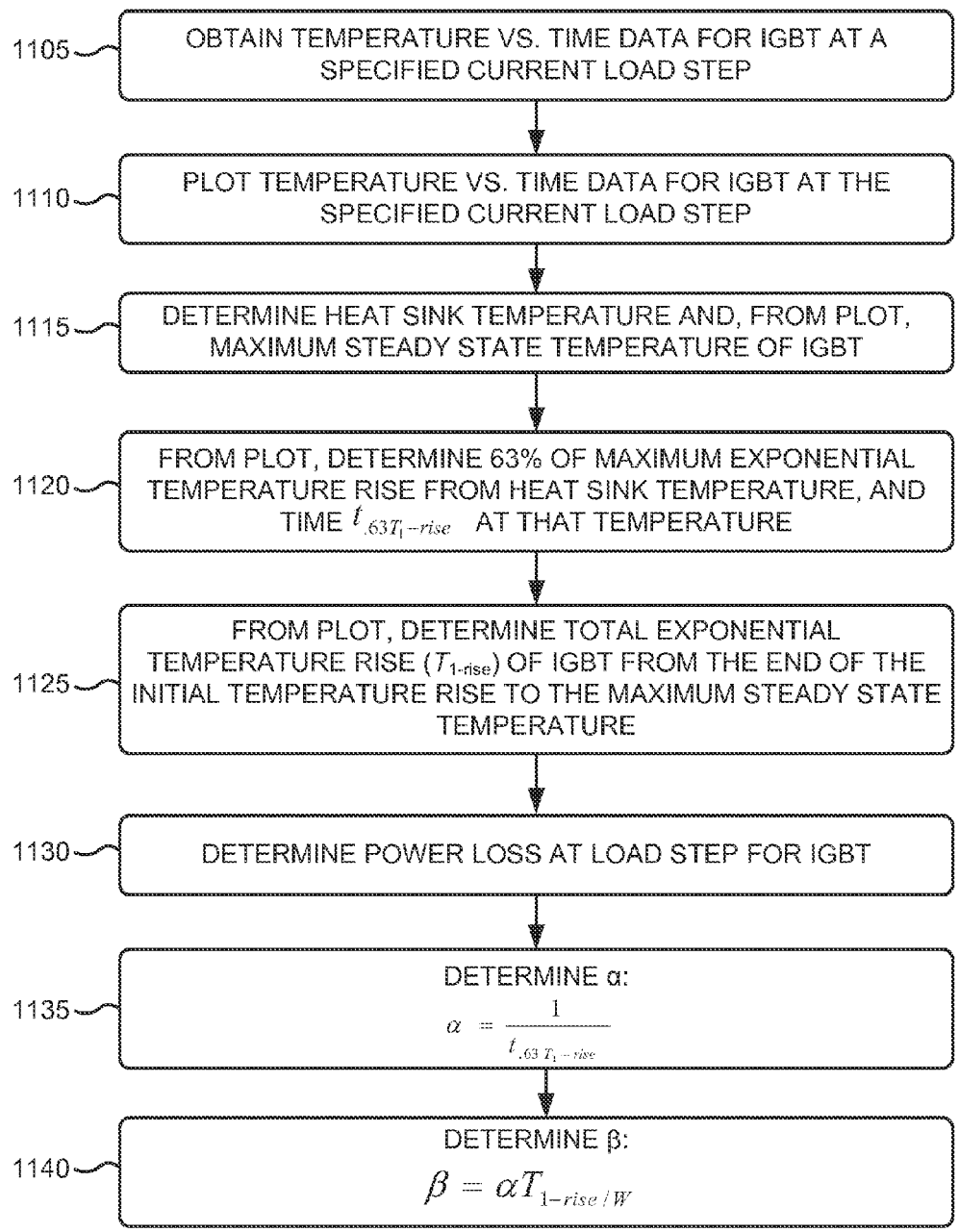
FIG. 11 is a flow diagram that illustrates an exemplary process for determining values for alpha ($\alpha$) and beta ($\beta$) of Eqns. (20), (21) and/or (22) below.

FIG. 11 is a flow diagram that illustrates an exemplary process for determining alpha ($\alpha$) and beta ($\beta$) for use in Eqns. (20), (21) and/or (22), as described further below with respect to blocks 1420 and 1440 of FIGS. 14A & 14B. The exemplary process of FIG. 11 is described with respect to FIGS. 12 and 13.

Temperature jump versus time data at a specified current load step, heat sink temperature, and DC link voltage may be obtained for a given IGBT (block 1100). For the given IGBT, the manufacturer's simulation software may, for example, be used to obtain simulated values of jumps in temperature given steps in load current, a heat sink temperature and a DC link voltage.

Figure 12:
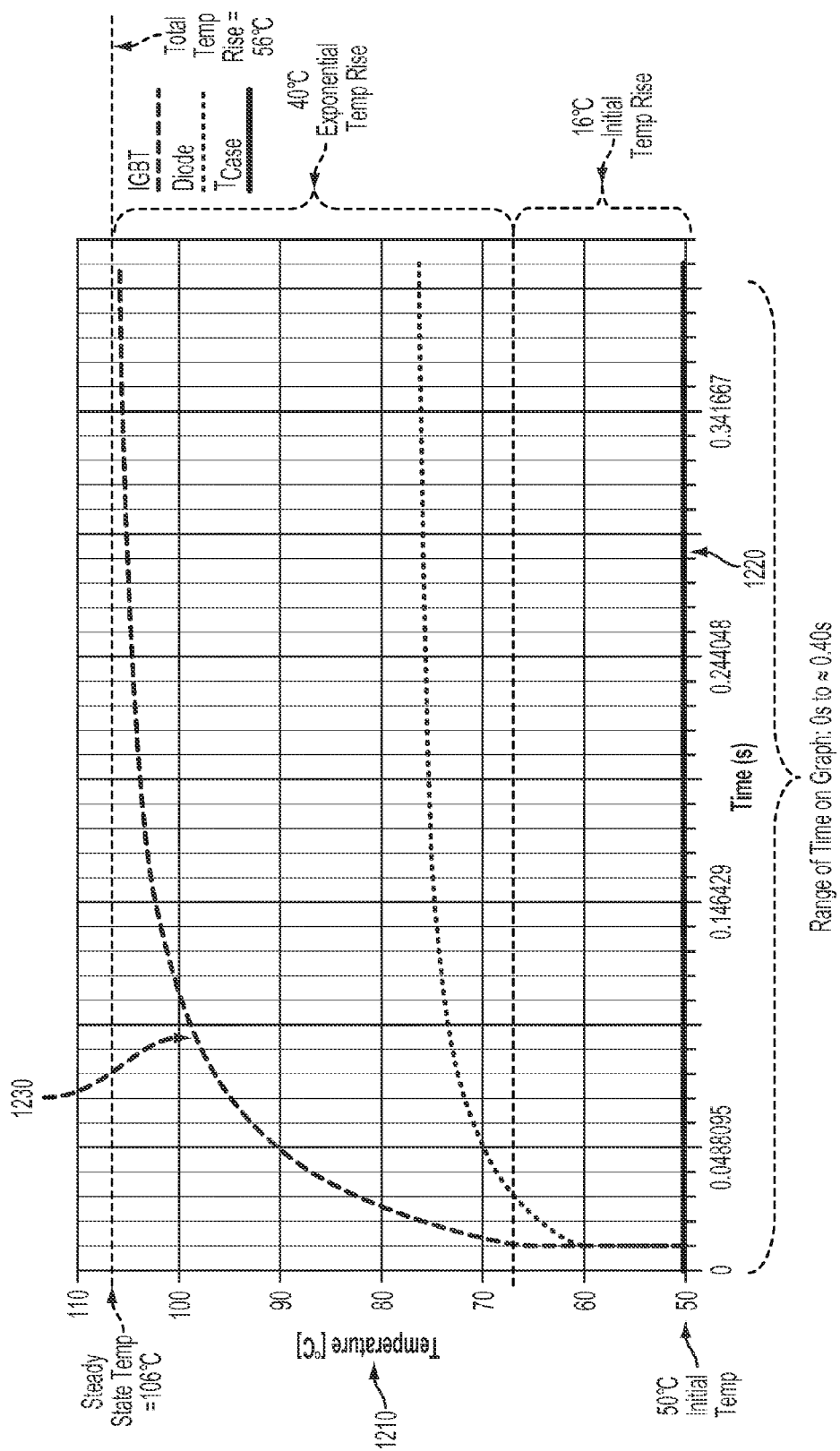
FIG. 12 is a diagram that depicts a plot of IGBT temperature versus time based on a 600 A load step, a heat sink temperature of 50 degrees Celsius, and a DC link voltage of 120V.
Figure 13:
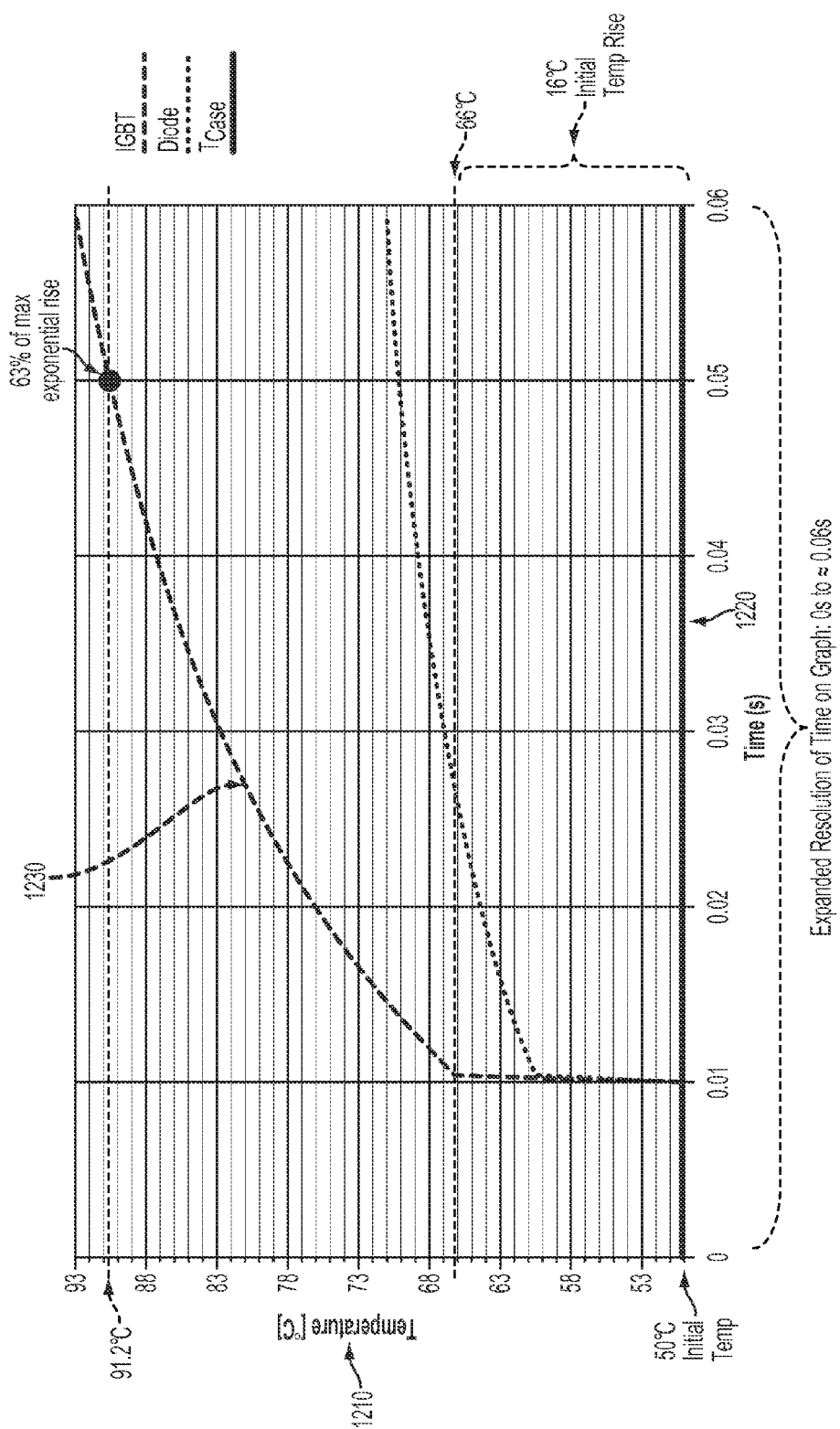
FIG. 13 is a diagram that depicts the depicts the plot of the IGBT temperature versus time of FIG. 12 with an expanded resolution of the time range on the time axis.

The obtained temperature versus time data may be plotted for the IGBT at the specified current load step (block 1110). FIG. 12 depicts an exemplary plot 1230 of IGBT temperature on a temperature axis 1210 versus time on a time axis 1220 for an FF600R06ME3 IGBT with a 600 A load step at an initial 50° C. heat sink temperature and a 135V DC link voltage. Given the time scale depicted in FIG. 12, the time on time axis 120 ranges from 0s to about 0.40 s. FIG. 13 depicts plot 1230 of the IGBT temperature, as previously depicted in FIG. 12, shown with a smaller time scale. FIG. 13, therefore, depicts an expanded resolution of the time range ranging from 0s to approximately 0.06 s.

The simulated temperature of the heat sink may be determined, and, from plot 1230 of FIG. 12, the maximum steady state temperature of IGBT 210 may be determined (1115). The simulated temperature of the temperature assumed during the simulation of block 1110 may be identified as the temperature of the heat sink. As shown in FIG. 12, plot 1230 may be evaluated to determine the maximum steady state temperature as time plotted on time axis 1220 increases. In FIG. 12, as time on time axis 1220 increases, IGBT temperature on temperature axis 1210 reaches a maximum steady state temperature of 106° C. 63% of the maximum exponential temperature rise from the initial heat sink temperature, and the time rise at which that temperature occurs may be determined (block 1120). As can be seen from plot 1230 of FIG. 12, the total IGBT temperature rise is from 50° C. to 106° C., which equals a total temperature rise of 56° C. Of the total 56° C. temperature rise, 16° C. is the initial temperature rise subsequent to the load step, and 40° C. is the temperature rise during the exponential portion of plot 1230. 63% of the exponential temperature rise is 25.2° C., so, as can be seen in FIG. 13, the temperature transition is 63% complete at 91.2° C. Taking the 63% point on temperature axis 1210 on plot 1230, it can be seen that the time in seconds on time axis 1220 is 0.05 s. Therefore, $t_{0.63 T_1\text{-}rise}$ is 0.05 s.

A total exponential temperature rise $T_{1\text{-}rise}$ of IBGT 210 from the end of the initial temperature rise to the maximum steady state temperature may be determined (block 1125). Referring to plot 1230 of FIG. 12, the initial temperature rise occurs from 50° C. to 66° C. The exponential temperature rise occurs from 66° C. to the maximum steady state temperature of 106° C., which, therefore, includes a total exponential temperature rise of $T_{1\text{-}rise} = 40$.

A power loss at a current load step may be determined for the IGBT 210 (block 1130). The previously obtained power loss vs. current data, from Table 1 above, may be used to determine the power loss at the simulated load step. Referring to Table 1 above, the power loss at a 600 A load step and at a bus DC link voltage of 120V is 1135 W (rounding to a whole number). Alpha a, from Eqn. (20) above, may be determined (block 1135) using the following:

$$\alpha = \frac{1}{t_{.63 T_1\text{-}rise}} \quad \text{Eqn. (27)}$$

$$\alpha = \frac{1}{0.05} = 20$$

Beta $\beta$, from Eqn. (20) above, may be determined (block 1140) using the following:

$$\beta = \alpha T_{1\text{-}rise/W} \quad \text{Eqn. (28)}$$

where $T_{1\text{-}rise/W} = T_{1\text{-}rise}$ divided by the power loss at the load step.

$$\beta = 20 * \frac{40}{1135} = 0.705$$

The values for $\alpha$ and $\beta$, calculated above, may be used in Eqns (20), (21) and/or (22) in the exemplary process of FIGS. 14A & 14B below.

Figure 14A:
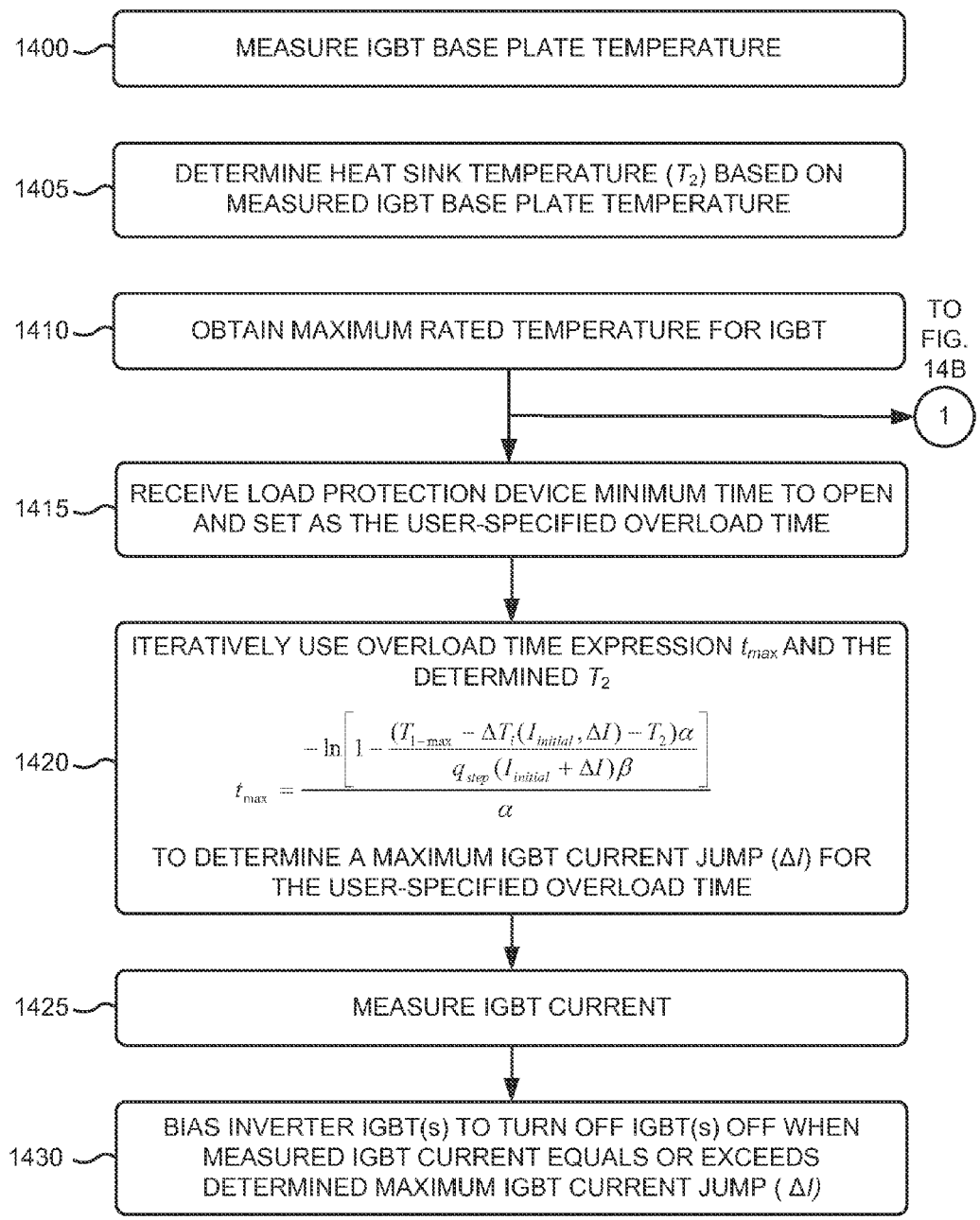
FIGS. 14A and 14B are flow diagrams that illustrate an exemplary process for selectively turning off the inverter IGBTs FIG. 2 based on measured IGBT current, measured IGBT temperature, measured overload time and using determined values for $q_{step}(I_{initial}+\Delta I)$, $\Delta T_i(I_{initial}, \Delta I)$, $\alpha$ and $\beta$.
Figure 14B:
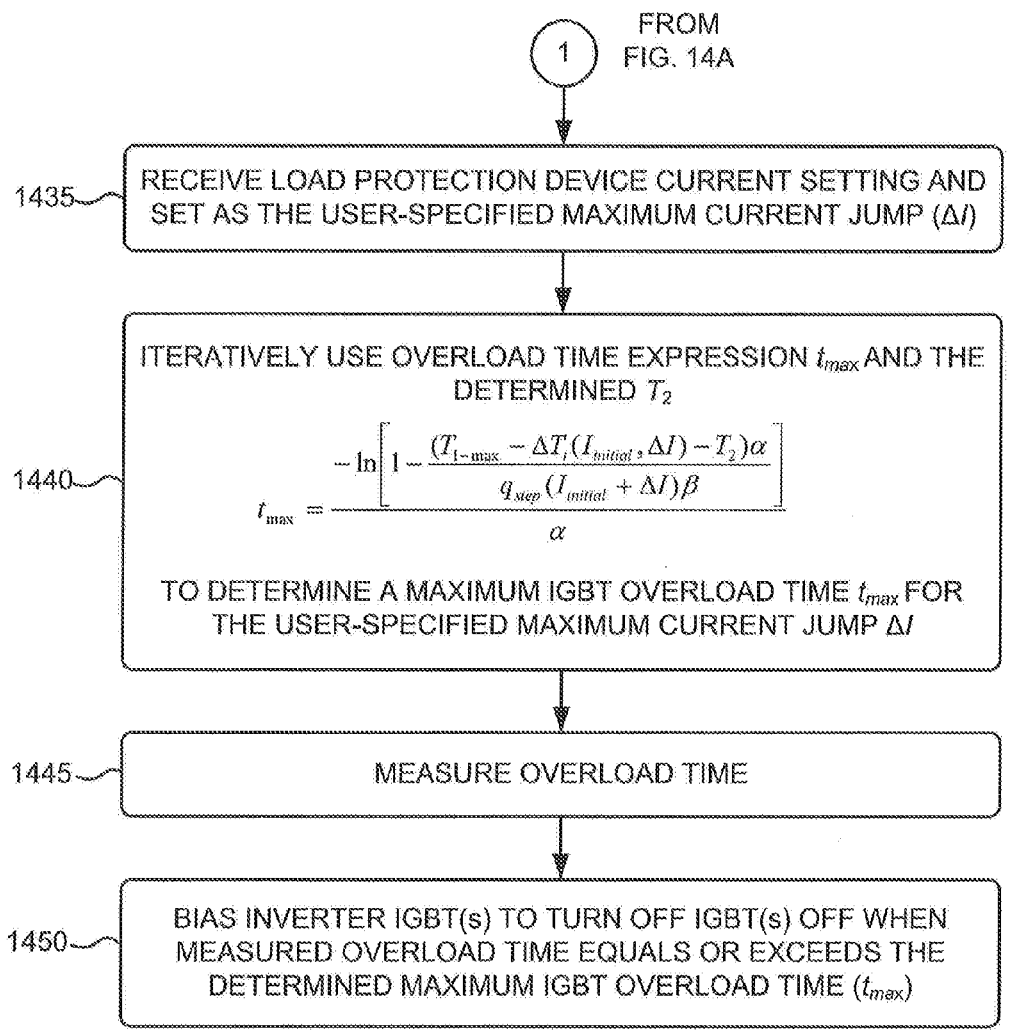

FIGS. 14A and 14B are flow diagrams that illustrate an exemplary process for selectively turning off the inverter IGBTs of FIG. 2 based on measured IGBT current, measured IGBT temperature, measured overload time, and using Eqn. (21) above, $q_{step}(I_{initial} + \Delta I)$ determined at block 520 in FIG. 5, $\Delta T_i(I_{initial}, \Delta I)$ determined in block 825 in FIG. 8, and values for $\alpha$ and $\beta$ determined in blocks 1135 and 1140 of FIG. 11. The IGBT base plate temperature may be measured (block 1400). NTC 440 of IGBT module 405 may measure the temperature of base plate 430, and may supply the temperature measurement to processing unit 300 of control unit 110. The heat sink temperature ($T_2$) may be determined based on the measured IGBT base plate temperature (block 1405). The manufacturer of IGBT module 405 provides data that estimates a relationship between the measured NTC temperature and the temperature of heat sink 410. This data may be used in block 1405 to determine the heat sink temperature $T_2$ based on the measured base plate temperature. The maximum rated temperature for IGBT 210 of inverter 120 may be obtained (block 1410). The maximum rated temperature of IGBT 210 can be obtained from, for example, manufacturer product specifications.

Subsequent to block 1410, the exemplary process of FIGS. 14A and 14B may include alternative blocks for controlling the biasing of IGBTs 210. In blocks 1415 through 1430, shown in FIG. 14A, the biasing of IGBTs 210 is controlled based on a load protection device "minimum time to open" setting, that is set as the user-specified overload time, and based on a maximum current jump that is determined by control unit 110 based on the user-specified overload time. The load protection device "minimum time to open," corresponding to user setting(s) 140, is a minimum amount of time required by the load protection device for opening when encountering a high current (i.e., a minimum time after a jump in current through the load protection device before the load protection device can react and open the circuit through the series-connected load). In blocks 1435 through 1450, shown in FIG. 14B, the biasing of IGBTs 210 is controlled based on a load protection device current setting, that is set as the user-specified maximum current jump, and based on a maximum overload time that is determined by control unit 110 based on the user-specified maximum current jump. The load protection device current setting, corresponding to user setting(s) 140, is a maximum current rating of the load protection device (i.e., the current at which the protection device opens to stop the flow of current through the series connected load).

In the alternative of blocks 1415 through 1430, control unit 110 receives a load protection device minimum time to open and sets it as the user-specified overload time ($t_{max}$) (block 1415). The overload time expression of Eqn. (21) and the determined heat sink temperature $T_2$ may be iteratively used to determine a maximum current jump ($\Delta I$) for the user-specified overload time ($t_{max}$) (block 1420). In one example, assuming an initial current $I_{initial}$ of 200 A RMS, a maximum temperature ($T_{1\text{-}max}$) for the IGBT of 165° C., a measurement of the base plate temperature equating to a 150° C. temperature ($T_2$) of heat sink 410, and a user specification of 20 milliseconds (ms) overload time (t), and taking Eqn. (21):

$$t_{max} = \frac{-\ln\left[1 - \frac{(T_{1-max} - \Delta T_i(I_{initial}, \Delta t) - T_2)\alpha}{q_{step}(I_{initial} + \Delta I)\beta}\right]}{\alpha}$$

and further inserting the expression for $q_{step}(I_{initial}+\Delta I)$ determined at block 520 in FIG. 5, the expression for $\Delta T_i(I_{initial}, \Delta I)$ determined in block 825 in FIG. 8, and values for $\alpha$ and $\theta$ determined in blocks 1135 and 1140 of FIG. 11:

Eqn. (29)

$$t_{max} = \frac{-\ln\left[1 - \frac{\left(165 - \left(\frac{(-2.764*10^{-5}(200) + 0.0256)\Delta I^2}{1000} + \frac{(5.84*10^{-5}(200) + 0.01172)\Delta I) - 150)(20)}{(0.0014(200 + \Delta I)^2 + 0.959(200 + \Delta I) + 60.43)(0.705)}\right)\right]}{20}$$

Figure 15:
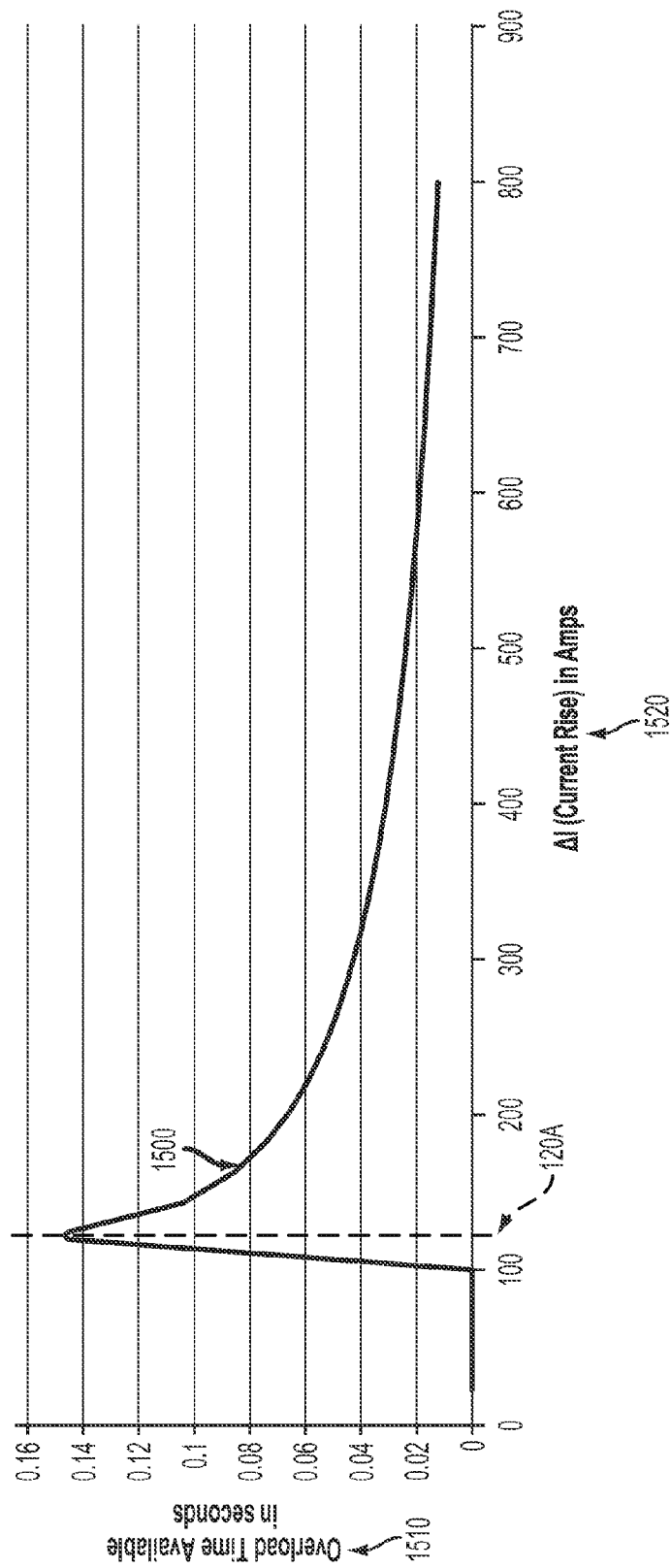
FIGS. 15 and 16 depict plots of IGBT overload time versus IGBT current jump.
Figure 16:
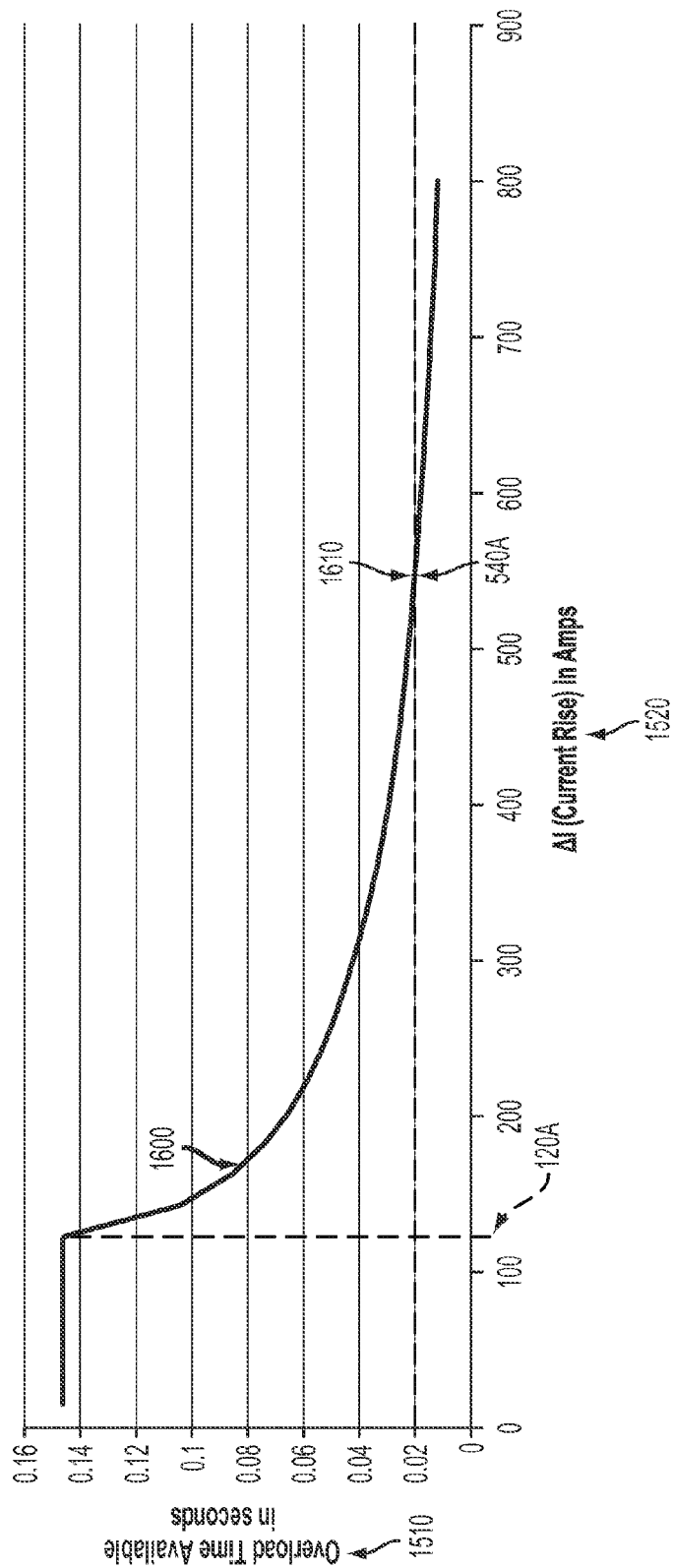

A plot 1500 of the analytical expression of Eqn. (29) is depicted in FIG. 15, with overload time plotted on an overload time axis 1510, and current rise plotted on a $\Delta I$ axis 1520. Since the expression of Eqn. (29) produces an overload time t of infinity at currents between 0 amps and about 120 amps, a lower limit on current rise should be set, as shown in FIG. 16. As shown in FIG. 16, in a new plot 1600, the current rise can be assumed to be 120 amps up until the logarithmic decline, and then plot 1600 follows plot 1500 from 120 amps and higher. Using plot 1600, a 20 ms user-specified overload time calculates to a current rise of 540 A on plot 1600. Alternatively, if the user specified maximum current jump is 540 A, then that current jump would calculate to a maximum overload time of 20 ms on plot 1600. The user may coordinate the overload current level and the overload time such that they are best suited to clear protection device(s) 200. For example, if the load protection device(s) includes fuses, then an optimized overload current level and overload time would allow for more current for less time to clear the fuses. If protection device(s) 200 includes a breaker system, an optimized overload current level and overload time would allow for a longer overload time because of the mechanical, and relatively slow, nature of the breakers. The maximum current jump $\Delta I$ and/or the maximum overload time represent changeable or customizable values that can be adaptively modified by the user for a specific IGBT 210, a specific protection device 200, and a specific UPS system 100.

The IBGT current may be measured (block 1425). Current measuring unit 310 of control unit 110 may measure the IGBT current. Control unit 110 may bias IGBTs 210 of inverter 120 so as to turn them off when the measured IGBT current equals or exceeds the maximum current jump ($\Delta I$) determined in block 1420 (block 1430). Once the IGBTs are turned off, a configurable time out period occurs after which the IGBTs are turned back on so inverter 120 resumes applying power to load(s) 135.

In the alternative of blocks 1435 through 1440, control unit 110 receives a load protection device current setting and sets it as the user-specified maximum current jump ($\Delta I$) (block 1435). The overload time expression of Eqn. (21) and the determined heat sink temperature $T_2$ may be iteratively used to determine the user-specified overload time $t_{max}$ for the user-specified maximum current jump $\Delta I$ (block 1440). In a similar example to that described above with respect to block 14420, an initial current $I_{initial}$ of 200 A RMS, a maximum temperature ($T_{1\text{-}max}$) for the IGBT of 165° C., a measurement of the base plate temperature equating to a 150° C. temperature ($T_2$) of heat sink 410, the user-specified maximum current jump $\Delta I$, the expression for $q_{step}(I_{initial}+\Delta I)$ determined at block 520 in FIG. 5, the expression for $\Delta T_i(I_{initial}, \Delta I)$ determined in block 825 in FIG. 8, and the values for $\alpha$ and $\beta$ determined in blocks 1135 and 1140 of FIG. 11, may be inserted into Eqn. (21) to calculate $t_{max}$.

The overload time may be measured (block 1445). Overload timer 320 of control unit 110 may measure an elapsed time since the beginning of the current jump (i.e., load step) through IGBTs 210. Control unit 110 may bias IGBTs 210 of inverter 120 so as to turn them off when the measured overload time equals or exceeds the maximum overload time $t_{max}$ determined in block 1440 (block 1450). Once the IGBTs are turned off, a configurable time out period occurs—after which the IGBTs are turned back on so inverter 120 resumes applying power to load(s) 135.

The foregoing description of implementations provides illustration and description, but is not intended to be exhaustive or to limit the invention to the precise form disclosed. Modifications and variations are possible in light of the above teachings or may be acquired from practice of the invention. For example, while series of blocks have been described with respect to FIGS. 5, 8, 11, 14A and 14B the order of the blocks may be varied in other implementations. Moreover, non-dependent blocks may be performed in parallel.

Certain features described above may be implemented as "logic" or a "unit" that performs one or more functions. This logic or unit may include hardware, such as one or more processors, microprocessors, application specific integrated circuits, or field programmable gate arrays, software, or a combination of hardware and software.

Although the invention has been described in detail above, it is expressly understood that it will be apparent to persons skilled in the relevant art that the invention may be modified without departing from the spirit of the invention. Various changes of form, design, or arrangement may be made to the invention without departing from the spirit and scope of the invention. Therefore, the above-mentioned description is to be considered exemplary, rather than limiting, and the true scope of the invention is that defined in the following claims.

No element, act, or instruction used in the description of the present application should be construed as critical or essential to the invention unless explicitly described as such. Also, as used herein, the article "a" is intended to include one or more items. Further, the phrase "based on" is intended to mean "based, at least in part, on" unless explicitly stated otherwise.

What is claimed is:

1. A method, comprising:
   receiving a user-specified overload time setting associated with a protection device connected in series with a load;
   measuring a current through a power transistor or an overload time associated with the current, wherein the power transistor supplies the current to the load and the protection device;
   measuring a temperature of a component associated with the power transistor;
   determining, based on the measured temperature, the measured current through the power transistor, and the user-specified overload time setting, a maximum power transistor overload current; and
   selectively turning off the power transistor when the measured current through the power transistor equals or exceeds the determined maximum power transistor overload current.

2. The method of claim 1, wherein the user-specified overload time setting comprises customizable values set by a user.

3. The method of claim 1, wherein the power transistor is a component of an inverter in an uninterruptible power supply (UPS).

4. The method of claim 1, wherein the power transistor comprises an insulated gate bipolar transistor (IGBT), a metal oxide semiconductor field effect transistor (MOSFET), or a junction gate field effect transistor (JFET).

5. The method of claim 4, wherein the component associated with the power transistor comprises a base plate of a module that includes the power transistor, wherein the base plate is coupled to a heat sink via a heat conducting material.

6. A method comprising:
   receiving a user-specified overload amperage setting associated with a protection device connected in series with a load;
   measuring a current through a power transistor or an overload time associated with the current, wherein the power transistor supplies the current to the load and the protection device;
   measuring a temperature of a component associated with the power transistor;
   determining, based on the measured temperature, the measured overload time, and the user-specified overload amperage setting, a maximum power transistor overload time; and
   selectively turning off the power transistor when the measured overload time equals or exceeds the determined maximum power transistor overload time.

7. The method of claim 6, wherein the user-specified overload amperage setting comprises customizable values set by a user.

8. The method of claim 6, wherein the power transistor is a component of an inverter in an uninterruptible power supply (UPS).

9. The method of claim 6, wherein the power transistor comprises an insulated gate bipolar transistor (IGBT), a metal oxide semiconductor field effect transistor (MOSFET), or a junction gate field effect transistor (JFET).

10. The method of claim 9, wherein the component associated with the power transistor comprises a base plate of a module that includes the power transistor, wherein the base plate is coupled to a heat sink via a heat conducting material.

11. A system, comprising:
    a current measuring unit configured to measure current through a power transistor;
    an overload timer configured to measure an overload time associated with the measured current; and
    a processing unit configured to:
    receive a user-specified overload time setting associated with a protection device connected in series with a load, wherein the power transistor supplies the current to the load,
    receive a temperature measurement of a component associated with the power transistor,
    determine, based on the measured temperature, the measured current through the power transistor, and the user-specified overload time setting, a maximum power transistor overload current, and
    selectively turn off the power transistor when the measured current through the power transistor equals or exceeds the determined maximum power transistor overload current.

12. The system of claim 11, wherein the user-specified overload time setting comprises customizable values set by a user.

13. The system of claim 11, wherein the system is an uninterruptible power supply (UPS) system and the power transistor is a component of an inverter in the UPS system.

14. The system of claim 11, wherein the power transistor comprises an insulated gate bipolar transistor (IGBT), a metal oxide semiconductor field effect transistor (MOSFET), or a junction gate field effect transistor (JFET).

15. The system of claim 14, wherein the component associated with the power transistor comprises a base plate of a module that includes the power transistor, wherein the base plate is coupled to a heat sink via a heat conducting material.

16. A system, comprising:
    a current measuring unit configured to measure current through a power transistor;
    an overload timer configured to measure an overload time associated with the measured current; and
    a processing unit configured to:
    receive a user-specified overload amperage setting associated with a protection device connected in series with a load, wherein the power transistor supplies the current to the load,
    receive a temperature measurement of a component associated with the power transistor, determine, based on the measured temperature, the measured overload time, and the user-specified overload amperage setting, a maximum power transistor overload time, and selectively turn off the power transistor when the measured overload time equals or exceeds the determined maximum power transistor overload time.

17. The system of claim 16, wherein the user-specified overload amperage comprises customizable values set by a user.

18. The system of claim 16, wherein the system is an uninterruptible power supply (UPS) system and the power transistor is a component of an inverter in the UPS system.

19. The system of claim 16, wherein the power transistor comprises an insulated gate bipolar transistor (IGBT), a metal oxide semiconductor field effect transistor (MOSFET), or a junction gate field effect transistor (JFET).

20. The system of claim 19, wherein the component associated with the power transistor comprises a base plate of a module that includes the power transistor, wherein the base plate is coupled to a heat sink via a heat conducting material.

21. A non-transitory computer-readable medium containing instructions executable by at least one processor, the computer-readable medium comprising:

one or more instructions for receiving a user-specified overload time setting associated with a protection device connected in series with a load;

one or more instructions for receiving a measurement of current through a power transistor or for receiving a measurement of overload time associated with the current, wherein the power transistor supplies the current to the load and the protection device;

one or more instructions for receiving a measurement of temperature of a component associated with the power transistor;

one or more instructions for determining, based on the measured temperature, the measured current through the power transistor, and the user-specified overload time setting, a maximum power transistor overload current;

one or more instructions for selectively turning off the power transistor when the measured current through the power transistor equals or exceeds the determined maximum power transistor overload current.

22. The non-transitory computer-readable medium of claim 21, wherein the user-specified overload time setting comprises customizable values set by a user.

23. The non-transitory computer-readable medium of claim 21, wherein the power transistor is a component of an inverter in an uninterruptible power supply (UPS) system.

24. The non-transitory computer-readable medium of claim 21, wherein the power transistor comprises an insulated gate bipolar transistor (IGBT), a metal oxide semiconductor field effect transistor (MOSFET), or a junction gate field effect transistor (JFET).

25. The non-transitory computer-readable medium of claim 24, wherein the component associated with the power transistor comprises a base plate of a module that includes the power transistor, wherein the base plate is coupled to a heat sink via a heat conducting material.

26. A non-transitory computer-readable medium containing instructions executable by at least one processor, the computer-readable medium comprising:

one or more instructions for receiving a user-specified overload amperage setting associated with a protection device connected in series with a load;

one or more instructions for receiving a measurement of current through a power transistor or for receiving a measurement of overload time associated with the current, wherein the power transistor supplies the current to the load and the protection device;

one or more instructions for receiving a measurement of temperature of a component associated with the power transistor;

one or more instructions for determining, based on the measured temperature, the measured overload time, and the user-specified overload amperage setting, a maximum power transistor overload time; and one or more instructions for selectively turning off the power transistor when the measured overload time equals or exceeds the determined maximum power transistor overload time.

27. The non-transitory computer-readable medium of claim 26, wherein the user-specified overload amperage setting comprises customizable values set by a user.

28. The non-transitory computer-readable medium of claim 26, wherein the power transistor is a component of an inverter in an uninterruptible power supply (UPS) system.

29. The non-transitory computer-readable medium of claim 26, wherein the power transistor comprises an insulated gate bipolar transistor (IGBT), a metal oxide semiconductor field effect transistor (MOSFET), or a junction gate field effect transistor (JFET).

30. The non-transitory computer-readable medium of claim 29, wherein the component associated with the power transistor comprises a base plate of a module that includes the power transistor, wherein the base plate is coupled to a heat sink via a heat conducting material.

* * * * *